(12) United States Patent
Kimura

(10) Patent No.: US 6,528,950 B2
(45) Date of Patent: Mar. 4, 2003

(54) ELECTRONIC DEVICE AND DRIVING METHOD

(75) Inventor: Hajime Kimura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/825,531

(22) Filed: Apr. 3, 2001

(65) Prior Publication Data
US 2002/0011799 A1 Jan. 31, 2002

(30) Foreign Application Priority Data
Apr. 6, 2000 (JP) ........................................ 2000-104395

(51) Int. Cl.$^7$ ................................................. G09G 3/10
(52) U.S. Cl. .......................... 315/169.3; 345/92; 345/76
(58) Field of Search ............................ 315/169.3, 169.1, 315/169.4; 345/92, 89, 84, 76, 79, 77

(56) References Cited

U.S. PATENT DOCUMENTS

| 5,247,190 A | 9/1993 | Friend et al. ................. 257/40 |
| 5,399,502 A | 3/1995 | Friend et al. ................. 437/1 |
| 5,640,067 A | 6/1997 | Yamaguchi et al. ........ 313/504 |
| 5,684,365 A | 11/1997 | Tang et al. .............. 315/169.3 |

FOREIGN PATENT DOCUMENTS

| JP | 10-092576 | 4/1998 |
| WO | WO 90/13148 | 11/1990 |

OTHER PUBLICATIONS

Tsutsui, T. et al, "Electroluminescence in Organic Thin Films," Photochemical Processes in Organized Molecular Systems, pp. 437–350, 1991.

Baldo, M.A. et al, "Highly Efficient Phosphorescent Emission from Organic Electroluminescent Devices," Nature, vol. 395, pp. 151–154, Sep. 10, 1998.

Baldo, M.A. et al, "Very High–Efficiency Green Organic Light–Emitting Devices Based on Electrophosphorescence," Applied Physics Letters, vol. 75, No. 1, pp. 4–6, Jul 5, 1999.

Tsutsui, T. et al, "High Quantum Efficiency in Organic Light–Emitting Devices with Iridium–Complex as a Triplet Emissive Center," Japanese Journal of Applied Physics, vol. 38, part 2, No. 12B, pp. L1502–L2504, Dec. 15, 1999.

Shenk, H, et al, "Polymers for Light Emitting Diodes," EuroDisplay '99, Proceedings of the 19th International Display Research Conference Berlin, Germany, Sep. 6–9, 1999, pp. 33–37.

English abstract re Japanes Patent Application No. 10–092576, published Apr. 10, 1998.

(List continued on next page.)

Primary Examiner—Don Wong
Assistant Examiner—Tuyet T. Vo
(74) Attorney, Agent, or Firm—Cook, Alex, McFarron, Manzo, Cummings & Mehler, Ltd.

(57) ABSTRACT

An electro-optical device is provided having a pixel portion with a novel structure, and in which display irregularities such as crosstalk, which develop due to a drop in voltage caused by the wiring resistance of electric current supply lines in an electro-optical device, are improved upon. Attention is drawn to the fact that during a period in which write in of a signal to a pixel from a signal line is not performed, a signal is not input to a source signal line and to a gate signal line, but are at a fixed electric potential. An electric current supply line and a source signal line, or an electric current supply line and a gate signal line, are connected through a switching transistor. A signal is input to a connection control line during a sustain period, and the connection transistor is made conductive. The source signal line or the gate signal line is therefore utilized as a pathway for supplying electric current to the EL element.

39 Claims, 23 Drawing Sheets

OTHER PUBLICATIONS

Shimoda et al., "High Resolution Light Emitting Polymer Display Driven by Low Temperature Polysilicon Thin Film Transistor with Integrated Driver," *Asia Display 98*. pp. 217–220.

Han et al., "3.8 Green OLED with Low Temperature Poly Si TFT," *Euro Display '99*. Sep. 1999, pp. 27–30.

Shimoda et al., "Invited Paper: Current Status and Future of Light–Emitting Polymer Display Driven by Poly–Si TFT," *SID 99 Digest*. pp. 372–375.

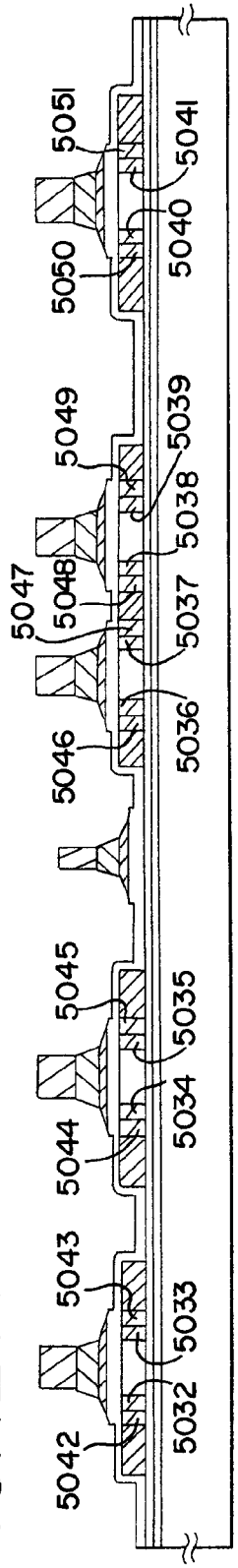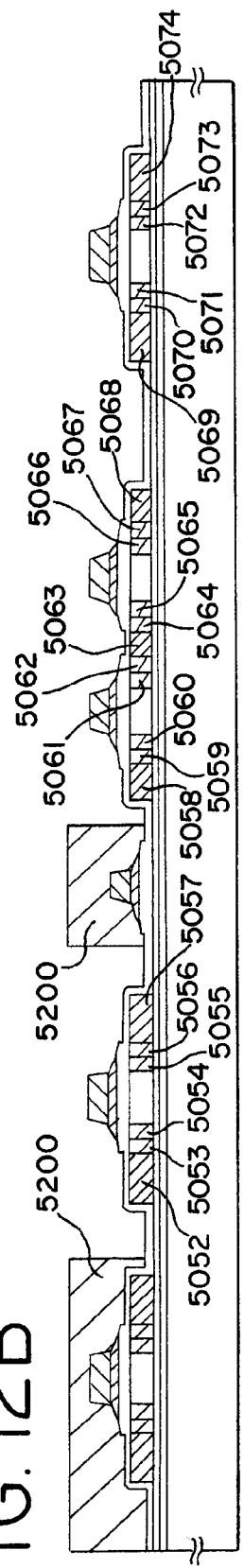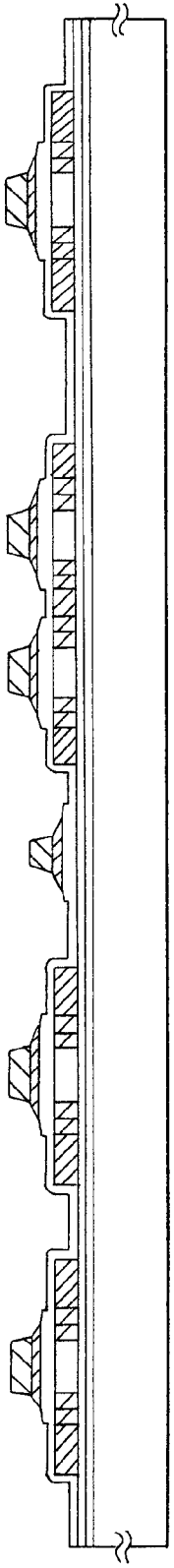

ELECTRONIC DEVICE AND DRIVING METHOD

BACKGROUND OF THE INVENTION

1. Field of the Invention

The present invention relates to a structure of an electronic device. In particular, the present invention relates to an active matrix electronic device having a thin film transistor (TFT) formed on an insulating body.

2. Description of the Related Art

Flat panel displays have been drawing attention in recent years as substitutes for LCDs (liquid crystal displays), and research into such displays is proceeding apace.

LCDs can roughly be divided into two types of driving methods. One is a passive matrix type using an LCD such as an STN-LCD, and the other is an active matrix type using an LCD such as a TFT-LCD. EL displays can also be similarly broken down roughly into two types; one a passive type, and the other an active type.

For the passive type, wirings which become electrodes are arranged in portions above and below EL elements. Voltages are applied to the wirings in order, and the EL elements turn on due to the flow of an electric current. On the other hand, each pixel has a TFT with the active matrix type, and a signal can be stored within each pixel.

A schematic diagram of an active matrix EL display device is shown in FIGS. 19A and 19B. FIG. 19A is a schematic diagram of an entire circuit, and the circuit has a pixel portion 1853 in its center. Gate signal line driver circuits 1852 for controlling the gate signal lines are arranged to the left and right of the pixel portion. The arrangement may also bw on only one side, left or right, but it is preferable to use both positions as shown in FIG. 19A considering such reasons as operational efficiency and reliability. A source signal line driver circuit 1851 for controlling source signal lines is arranged above the pixel portion. A circuit for one pixel in the pixel in the pixel portion 1853 of FIG. 19A is shown in FIG. 19B. Reference numeral 1801 denotes a TFT which functions as a switching element during write in of a signal to the pixel (hereafter referred to as switching TFT) in FIG. 19B. Reference numeral 1802 denotes a TFT (hereafter referred to as EL driver TFT) which functions as an element (electric current control element) for controlling electric current supplied to EL elements 1803. From the fact that it is good for TFT operation to have a source region connected to ground, and from limitation on the fabrication of the EL elements 1803, p-channel TFTs are used as the EL driver TFTs. A general structure in which the EL driverTFT is arranged between an anode of the EL element 1803 and an electric current supply line 1807 is often employed. Reference numeral 1804 denotes a storage capacitor for storing a signal (voltage) input from a source signal line 1806. One terminal of the storage capacitor 1804 of FIG. 19B is connected to ther electric current supply line 1807, but a special-purpose wiring may also be used. A gate terminal of the switching TFT 1801 is connected to a gate signal line 1805, and a source terminal of the switching TFT 1801 is connected to the source signal line 1806. Further, a drain terminal of the EL driver TFT 1802 is connected to the anode or a cathode of the EL element 1803, and a source terminal of the EL driver TFT 1802 is connected to the electric current supply line 1807.

The EL elements have a layer (hereafter referred to as an EL layer) containing an organic compound in which electroluminescence (luminescence generated by application of an electric field) is obtained, the anode, and the cathode. There is emission of light in the organic compound when returning to a base state from a singlet excitation state (fluorescence), and when returning to a base state from a triplet excitation state (phosphorescence), and it is possible to apply both types of light emission with the present invention.

Note that all layers formed between the anode and the cathode are defined as EL layers throughout this specification. These layers include, specifically, layers such as a light emitting layer, a hole injecting layer, an electron injecting layer, a hole transporting layer, and an electron transporting layer. Specifically, EL element may have a structure in which an anode, a light emitting layer, and a cathode are laminated in order. In addition, structures such as one in which an anode, a hole injecting layer, a light emitting layer, and a cathode, and one in which an anode, a hole transporting layer, a light emitting layer, and an electron transporting layer are laminated in order, may also be used.

Further, elements formed by an anode, an EL layer, and a cathode are referred to as EL elements throughout this specification.

Circuit operation of the active matrix electronic device is explained next with reference to FIGS. 19A and 19B. First, the gate of the switching TFT 1801 opens when the gate signal line 1805 is selected, a voltage is applied to a gate electrode of the switching TFT 1801, and the switching TFT 1801 is placed in a conducting state. The signal (voltage) of the source signal line 1806 is thus stored in the storage capacitor 1804. The voltage of the storage capacitor 1804 becomes a voltage $V_{GS}$ between the gate and the source of the EL driver TFT 1802, and therefore the electric current, which responds to the storage capacitor 1804 voltage, flows in the EL driver TFT 1802 and in the EL element 1803. As a result, the EL element 1803 turns on.

The brightness of the EL element 1803, namely the amount of electric current flowing in the EL element 1803, can be controlled by $V_{GS}$. $V_{GS}$ is the voltage stored in the storage capacitor 1804, and is the signal (voltage) to be input to the source signal line 1806. In other words, the brightness of the EL element 1803 is controlled by controlling the signal (voltage) to be input to the source signal line 1806. Finally, the gate signal line 1805 is unselected, the gate of the switching TFT 1801 closes, and the switching TFT 1801 is placed in a non-conducting state. The electric charge stored in the storage capacitor 1804 continues to be stored at this point. $V_{GS}$ is therefore stored as is, and the electric current in response to $V_{GS}$ continues to flow in the EL driver TFT 1802 and in the EL element 1803.

Information regarding the above explanation is reported upon in papers such as the following: "Current Status and Future of Light-emitting Polymer Display Driven by Poly-Si TFT", SID99 Digest, p. 372; "High Resolution Light Emitting Polymer Display Driven by Low Temperature Polysilicon Thin Film Transistor with Integrated Driver", ASIA DISPLAY 98, p. 217; and "3.8 Green OLED with Low Temperature Poly-Si TFT", Euro Display 99 Late News, p. 27.

Along with high definition, large size screens are sought after with active matrix EL displays. However, the increase in the length of wirings which accompanies making larger screens becomes a cause of problems such as insufficient write in time and dispersion in the electric current supplied. In particular, the dispersion in the amount of electric current supplied to the EL element due to the resistance of the electric current supply lines is directly connected with display irregularities such as uneven brightness within the screen and crosstalk, and therefore is a burden to making screens larger.

A method of reducing the resistance in the electric current supply lines for each pixel by increasing the number of electric current supply lines can be given as a way of solving the above problem. However, simply increasing the number of wirings in the pixel portion or increasing the cross sectional area of the wirings invites a reduction in the aperture ratio, and cannot be said to be a desirable method.

A novel pixel structure not found conventionally is thus sought after in order to reduce the wiring resistance while maintaining a high aperture ratio.

SUMMARY OF THE INVENTION

The present invention answers such demands, and an object of the present invention is to provide an electronic device in which the number of electric current supply routes can be increased and in which wiring resistance can be reduced by using pixels having a novel structure.

The following means are discussed in order to resolve the problems with the above conventional techniques.

The present invention focuses on the fact that, in a structure of a pixel portion of an electronic device, gate signal lines and source signal lines existing in the pixel portion, in addition to electric current supply lines, are maintained at a certain fixed electric potential outside of a period for performing signal write in of signals to pixels. With the present invention, the electric potential of the gate signal lines and the source signal lines during a sustain (turn on) period which does not overlap with an address (write in) period is set equal to the electric potential of the electric current supply lines, and the gate signal lines or the source signal lines can be used as electric current supply lines by electrically connecting them to electric current supply lines through TFTs.

A method of adding new electric current supply lines is the simplest way of increasing the electric current supply paths. However, with the present invention the source signal lines and the gate signal lines can be utilized as routes of electric current supply, and therefore it becomes possible to increase the electric current supply paths with greater efficiency than by simply adding electric current supply lines as described above. As a result, the wiring resistance is lowered, and it becomes possible to eliminate such as uneven brightness and crosstalk. This can contribute greatly to an increase in quality.

Structures of the electronic device of the present invention are stated below.

According to a first aspect of the present invention, an electronic device comprising a source signal line side driver circuit, a gate signal line side driver circuit, and a pixel portion; is characterized in that:

the pixel portion has a plurality of source signal lines, a plurality of gate signal lines, a plurality of electric current supply lines, a connection control line, and a plurality of pixels;

each of the plurality of pixels has an EL element, and a first connection transistor or a second connection transistor;

a gate electrode of the first connection transistor is electrically connected to the connection control line;

one of a source region and a drain region of the first connection transistor is electrically connected to any one of the plurality of source signal lines, and the other one of the source region and the drain region is electrically connected to any one of the plurality of electric current supply lines;

a gate electrode of the second connection transistor is electrically connected to the connection control line; and one of a source region and a drain region of the second connection transistor is electrically connected to any one of the plurality of gate signal lines, and the other one of the source region and the drain region is electrically connected to any one of the plurality of electric current supply lines.

According to a second aspect of the present invention, an electronic device comprising a source signal line side driver circuit, a gate signal line side driver circuit, and a pixel portion; is characterized in that:

the pixel portion has a plurality of source signal lines, a plurality of gate signal lines, a plurality of electric current supply lines, a connection control line, and a plurality of pixels;

each of the plurality of pixels has an EL element and a connection transistor;

a gate electrode of the connection transistor is electrically connected to the connection control line; and one of a source region and a drain region of the connection transistor is electrically connected to any one of the plurality of source signal lines, and the other one of the source region and the drain region is electrically connected to any one of the plurality of electric current control lines.

According to a third aspect of the present invention, an electronic device, comprising a source signal line side driver circuit, a gate signal line side driver circuit, and a pixel portion; is characterized in that:

the pixel portion has a plurality of source signal lines, a plurality of gate signal lines, a plurality of electric current supply lines, a connection control line, and a plurality of pixels;

each of the plurality of pixels has an EL element and a connection transistor;

a gate electrode of the connection transistor is electrically connected to the connection control line; and one of a source region and a drain region of the connection transistor is electrically connected to any one of the plurality of gate signal lines, and the other one of the source region and the drain region is electrically connected to any one of the plurality of electric current control lines.

According to a fourth aspect of the present invention, an electronic device comprising a source signal line side driver circuit, a gate signal line side driver circuit, and a pixel portion; is characterized in that:

the pixel portion has a plurality of source signal lines, a plurality of gate signal lines, a plurality of electric current supply lines, a connection control line, and a plurality of pixels;

each of the plurality of pixels has an EL element, a first connection transistor, and a second connection transistor;

a gate electrode of the first connection transistor is electrically connected to the connection control line;

one of a source region and a drain region of the first connection transistor is electrically connected to any one of the plurality of source signal lines, and the other one of the source region and the drain region is electrically connected to any one of the plurality of electric current supply lines;

a gate electrode of the second connection transistor is electrically connected to the connection control line; and one of a source region and a drain region of the second connection transistor is electrically connected to any one of the plurality of gate signal lines, and the other one of the source region and the drain region is electrically connected to any one of the plurality of electric current supply lines.

According to a fifth aspect of the present invention, an electronic device comprising a source signal line side driver circuit, a gate signal line side driver circuit, and a pixel portion; is characterized in that:

the pixel portion has a plurality of source signal lines, a plurality of gate signal lines, a plurality of electric current supply lines, a connection control line, and a plurality of pixels;

each of the plurality of pixels has an EL element, a first connection transistor, and a second connection transistor;

a gate electrode of the first connection transistor is electrically connected to the connection control line;

one of a source region and a drain region of the first connection transistor is electrically connected to any one of the plurality of source signal lines, and the other one of the source region and the drain region is electrically connected to any one of the plurality of electric current supply lines;

a gate electrode of the second connection transistor is electrically connected to the connection control line; and one of a source region and a drain region of the second connection transistor is electrically connected to any one of the plurality of source signal lines, and the other one of the source region and the drain region is electrically connected to any one of the plurality of gate signal lines.

According to a sixth aspect of the present invention, an electronic device comprising a source signal line side driver circuit, a gate signal line side driver circuit, and a pixel portion; is characterized in that:

the pixel portion has a plurality of source signal lines, a plurality of gate signal lines, a plurality of electric current supply lines, a connection control line, and a plurality of pixels;

each of the plurality of pixels has an EL element, a first connection transistor, and a second connection transistor;

a gate electrode of the first connection transistor is electrically connected to the connection control line;

one of a source region and a drain region of the first connection transistor is electrically connected to any one of the plurality of gate signal lines, and the other one of the source region and the drain region is electrically connected to any one of the plurality of electric current supply lines;

a gate electrode of the second connection transistor is electrically connected to the connection control line; and one of a source region and a drain region of the second connection transistor is electrically connected to any one of the plurality of source signal lines, and the other one of the source region and the drain region is electrically connected to any one of the plurality of gate signal lines.

According to a seventh aspect of the present invention, an electronic device comprising a source signal line side driver circuit, a gate signal line side driver circuit, and a pixel portion; is characterized in that:

the pixel portion has a plurality of source signal lines, a plurality of gate signal lines, a plurality of electric current supply lines, a connection control line, and a plurality of pixels;

each of the plurality of pixels has an EL element, a first connection transistor, a second connection transistor, and a third connection transistor;

a gate electrode of the first connection transistor is electrically connected to the connection control line;

one of a source region and a drain region of the first connection transistor is electrically connected to any one of the plurality of source signal lines, and the other one of the source region and the drain region is electrically connected to any one of the plurality of electric current supply lines;

a gate electrode of the second connection transistor is electrically connected to the connection control line;

one of a source region and a drain region of the second connection transistor is electrically connected to any one of the plurality of gate signal lines, and the other one of the source region and the drain region is electrically connected to any one of the plurality of electric current supply lines;

a gate electrode of the third connection transistor is electrically connected to the connection control line; and one of a source region and a drain region of the third connection transistor is electrically connected to any one of the plurality of source signal lines, and the other one of the source region and the drain region is electrically connected to any one of the plurality of gate signal lines.

According to an eighth aspect of the present invention, an electronic device, according to any of the first to seventh aspects of this invention, is characterized in that:

the polarity of an EL driver transistor is p-channel type when one of a source region and a drain region of the EL driver transistor is electrically connected to an anode of the EL element; and the polarity of an EL driver transistor is n-channel type when one of the source region and the drain region of the EL driver transistor is electrically connected to a cathode of the EL element.

According to a ninth aspect of the present invention, an electronic device, according to any of the first to eighth aspects of this invention, is characterized in that:

the polarity of a switching transistor is identical to the polarity of the EL driver transistor.

According to a tenth aspect of the present invention, an electronic device, according to any of the first to ninth aspects of this invention, is characterized in that:

the gate signal lines are composed of aluminum, or of a material having aluminum as its main constituent.

According to an eleventh aspect of the present invention, a method of driving an electronic device, comprising n-bit gray scale control by controlling the length of time during which an EL element is turned on, is characterized in that:

a frame period has n subframe periods $SF_1, SF_2, \ldots, Sf_n$;

the n subframe periods have address (write in) periods $Ta_1, Ta_2, \ldots, Ta_n$, and sustain (turn on) periods $Ts_1, Ts_2, \ldots, Ts_n$, respectively;

the length of the sustain (turn on) periods is set so that $Ts_1::Ts_2:: \ldots ::Ts_n = 2^{(n-1)}::2^{(n-2)}:: \ldots ::2^0$;

a first connection transistor or a second connection transistor is conductive during the sustain (turn on) periods which do not overlap with the address (write in) periods; and an electric current supply line and a source signal line electrically connected to a source region and a drain region of the first connection transistor are placed in a conducting state, or an electric current supply line and a source signal line electrically connected to a source region and a drain region of the second connection transistor are placed in a conducting state.

According to a twelfth aspect of the present invention, a method of driving an electronic device, comprising n-bit gray scale control by controlling the length of time during which an EL element is turned on, is characterized in that:

a frame period has n subframe periods $SF_1, SF_2, \ldots, Sf_n$;

the n subframe periods have address (write in) periods $Ta_1, Ta_2, \ldots, Ta_n$, and sustain (turn on) periods $Ts_1, Ts_2, \ldots, Ts_n$, respectively;

the length of the sustain (turn on) periods is set so that $Ts_1::Ts_2:: \ldots ::Ts_n = 2^{(n-1)}::2^{(n-2)}:: \ldots ::2^0$; and the supply of electric current to the EL element during the sustain (turn on) periods which do not overlap with the address (write in) periods is performed by an electric current supply line and: a source signal line electrically connected to the electric current supply line through a first connection transistor; or a gate signal line electrically connected to the electric current supply line through a second connection transistor.

According to a thirteenth aspect of the present invention, a method of driving an electronic device, comprising n-bit gray scale control by controlling the length of time during which an EL element is turned on, is characterized in that:

a frame period has n subframe periods $SF_1, SF_2, \ldots, Sf_n$;

the n subframe periods have address (write in) periods $Ta_1, Ta_2, \ldots, Ta_n$, and sustain (turn on) periods $Ts_1, Ts_2, \ldots, Ts_n$, respectively;

the length of the sustain (turn on) periods is set so that $Ts_1::Ts_2:: \ldots ::Ts_n = 2^{(n-1)}::2^{(n-2)}:: \ldots ::2^0$; and an electric current supply line and a number i row gate signal line electrically connected to a source region and a drain region of a connection transistor are placed in a conducting state with the number i gate signal line is unselected.

BRIEF DESCRIPTION OF THE DRAWINGS

In the accompanying drawings:

FIGS. 12A to 12C are diagrams showing the example of a method of manufacturing an electronic device shown in Embodiment 2;

DETAILED DESCRIPTION OF THE PREFERRED EMBODIMENTS

Embodiment Mode

An embodiment mode of the present invention is explained. Electric current supply lines are not connected to other wirings, for example to source signal lines or gate signal lines, in a convention pixel structure. With the present invention, however, other wirings, for example source signal lines, gate signal lines, or both, are connected to electric current supply lines through TFTs. The TFTs used here are referred to as connection TFTs. The connection TFTs are then placed in a conducting state only when necessary (when the source signal line or gate signal lines are used as electric current supply lines), placing the electric current supply lines in a state of electrical connection to the other wirings. When the connection TFTs are in a non-conducting state, the electric current supply lines are not electrically connected to the other wirings. Therefore, even if the electric potential of the electric current supply lines, source signal lines, and gate signal line change, there is no mutual influence imparted.

Figure 1A:
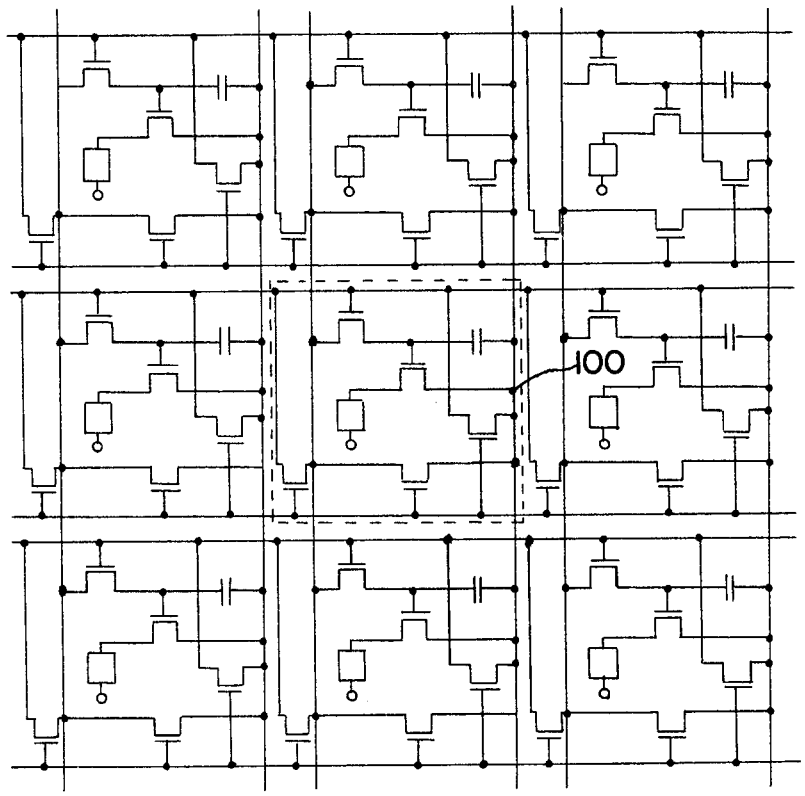
FIG. 1 is a circuit diagram of a pixel portion of an electronic device of the present invention.
Figure 1B:
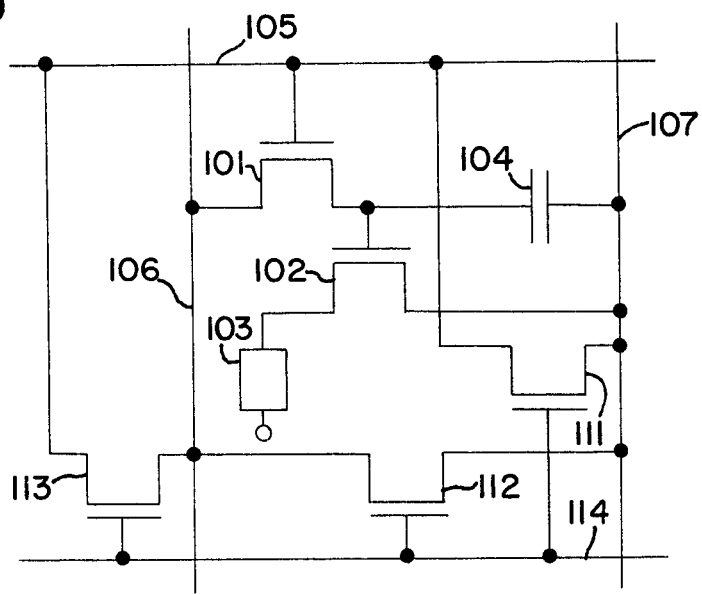

A structure of a pixel of the present invention is shown in FIGS. 1A and 1B. An enlargement of one pixel shown by a region 100 surrounded by a dotted line frame, from among the 3×3 pixels shown in FIG. 1A, is shown in FIG. 1B. A gate signal line 105 and an electric current supply line 107 are connected through a connection TFT 111. In addition, a source signal line 106 and the electric current supply line 107 are connected through a connection TFT 112, and the gate signal line 105 and the source signal line 106 are connected through a connection TFT 113. Gate electrodes of the connection TFTs 111, 112, and 113 are connected to a connection control line 114. A signal is then input to the connection control line 114 when necessary, and the connection TFTs 111, 112, and 113 are placed in a conducting state. The electric potential of the source signal line 106 is set to the same electric potential as that of the electric current supply line 107 at this point and the gate signal line 105 electric potential is also set the same as the electric current supply line 107 electric potential.

The switching TFT 101 needs to be in a non-conducting state at this time, and therefore it is preferable to use a p-channel TFT for the switching TFT 101.

As a result of the above structure, the electric current flowing in the EL element 103 is not only the electric current flowing in the electric current supply line 107, but also the electric current flowing via the source signal line 106 and the gate signal line 105. The effective resistance of the wirings can therefore be lowered, and the voltage drop in the wiring portions also becomes less, and can consequently contribute greatly to a drop in uneven brightness and a drop in crosstalk within a screen.

In the present invention, the source signal line 106 and the gate signal line 105 are used in not only a purpose of transferring signal and controlling TFT but also a purpose of supplying electic current flowing in the EL element 103. However, signal write in to the pixel and electric current supply to the EL element 103 cannot both be performed at the same time. The selection TFTs 111, 112, and 113 must therefore be placed in a non-conducting state during periods in which write in of the signal to the pixel (address (write in) period) overlaps with the supply of electric current to the EL element 103 (sustain (turn on) period).

Embodiments

Embodiments of the present invention are described below.

Embodiment 1

FIGS. 2 to 7 show examples of structures of circuits in a pixel portion in order to implement a structure of the present invention. One pixel surrounded by a dotted line frame with the figures is taken as a standard for the following discussion.

Figure 2:
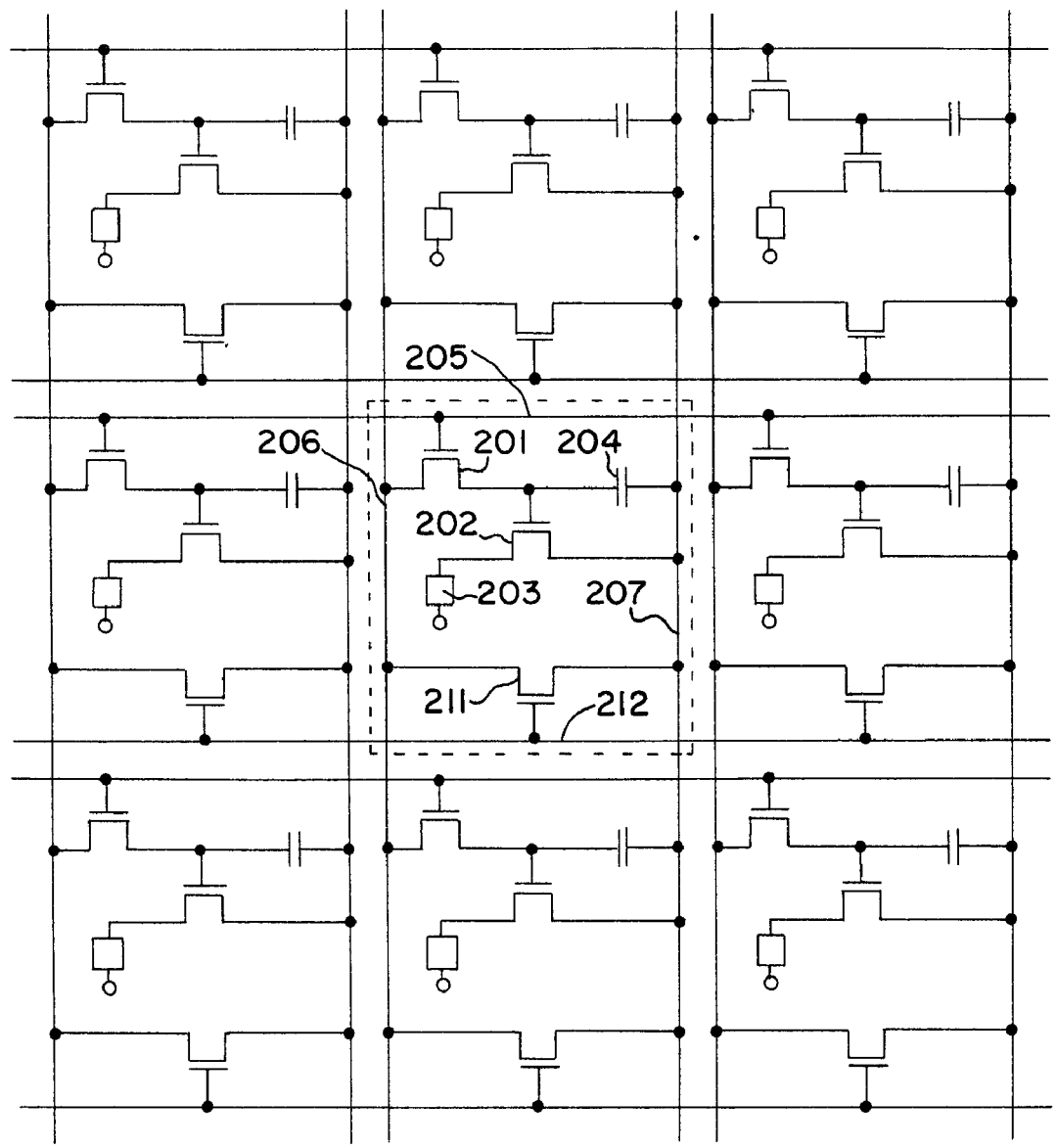
FIG. 2 is an example of a circuit structure for explaining an application to an EL display shown in Embodiment 1.
Figure 3:
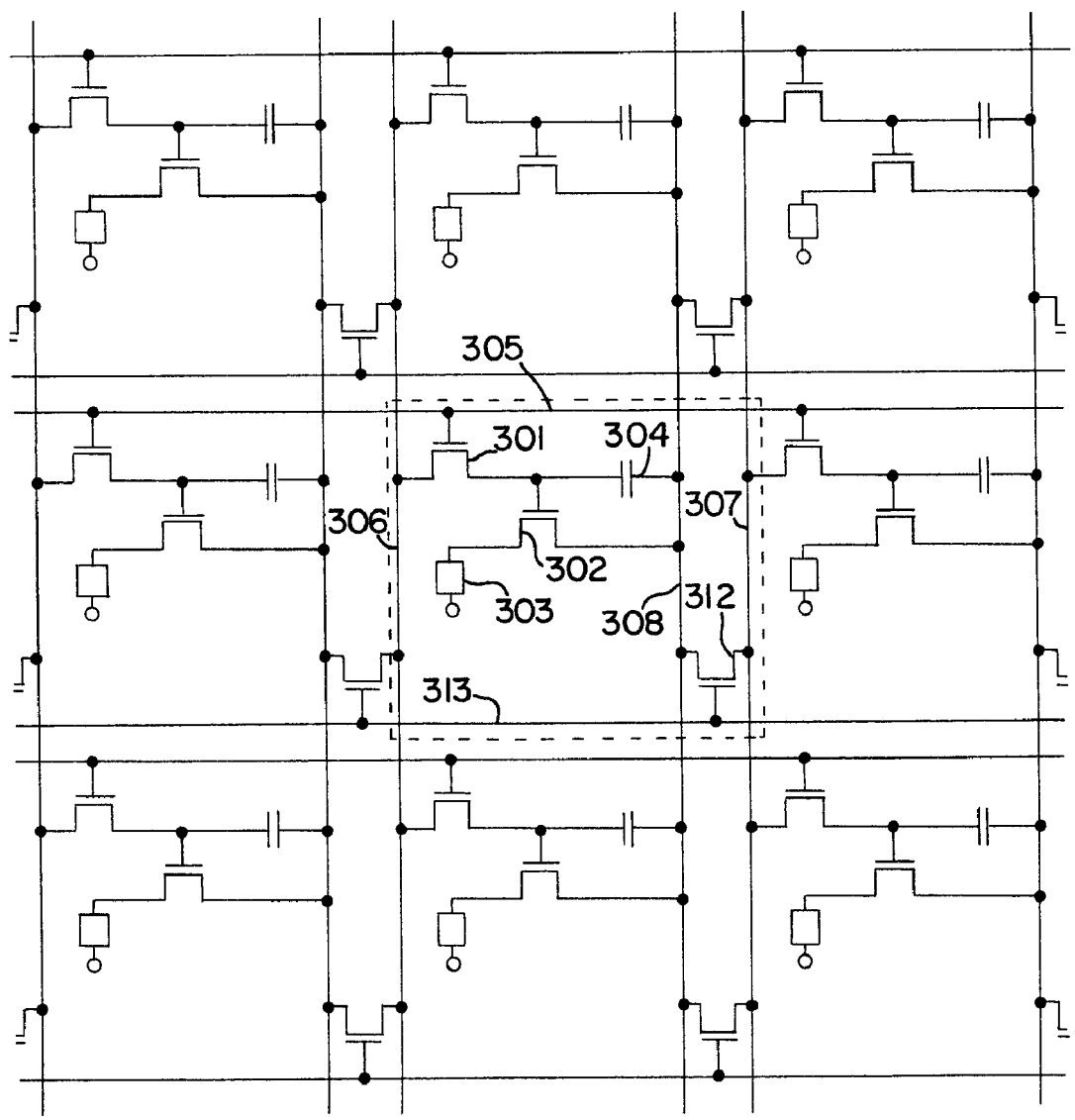
FIG. 3 is an example of a circuit structure for explaining an application to the EL display shown in Embodiment 1.
Figure 4:
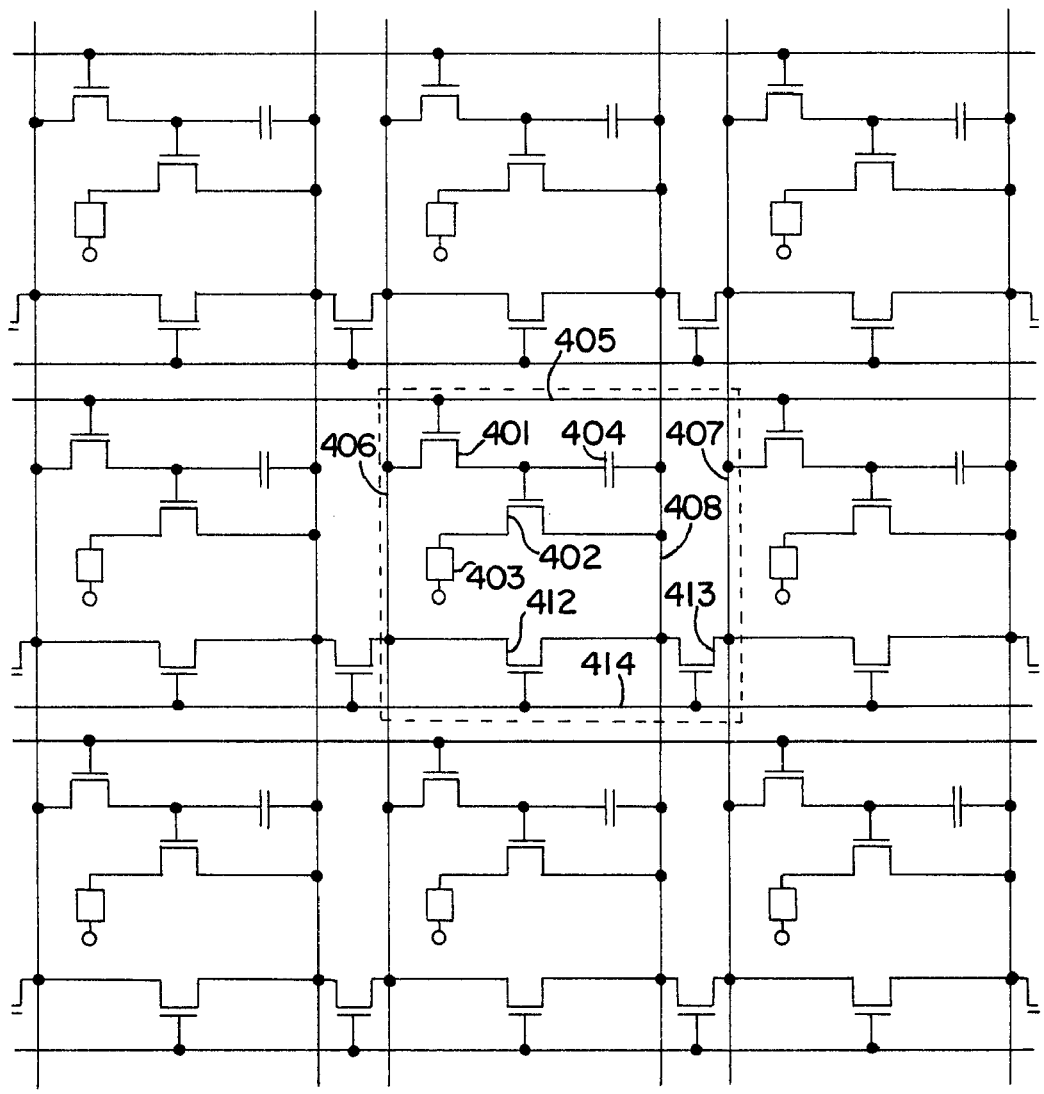
FIG. 4 is an example of a circuit structure for explaining an application to the EL display shown in Embodiment 1.

A source signal line 206 and an electric current supply line 207 are connected through a connection TFT 211 within a pixel in FIG. 2. In FIG. 3, an electric current supply line 308 and a source signal line 307 of an adjacent pixel are connected through a connection TFT 312. In this case, it becomes possible to avoid a large reduction in the aperture ratio, compared with FIG. 2, because the connection TFT can be arranged between two pixels. In FIG. 4, an electric current supply line 408 and a source signal line 406 are connected through a connection TFT 412 within the pixel itself, and in addition, are also connected to a source signal line 407, which is connected to an adjacent pixel, through a connection TFT 413. The electric current supply lines of the circuit structure examples shown by FIGS. 2 to 4 are not connected to gate signal lines. N-channel TFTs may therefore be used for switching TFTs 201, 301, and 401. P-channel TFTs may of course also be used.

Figure 5:
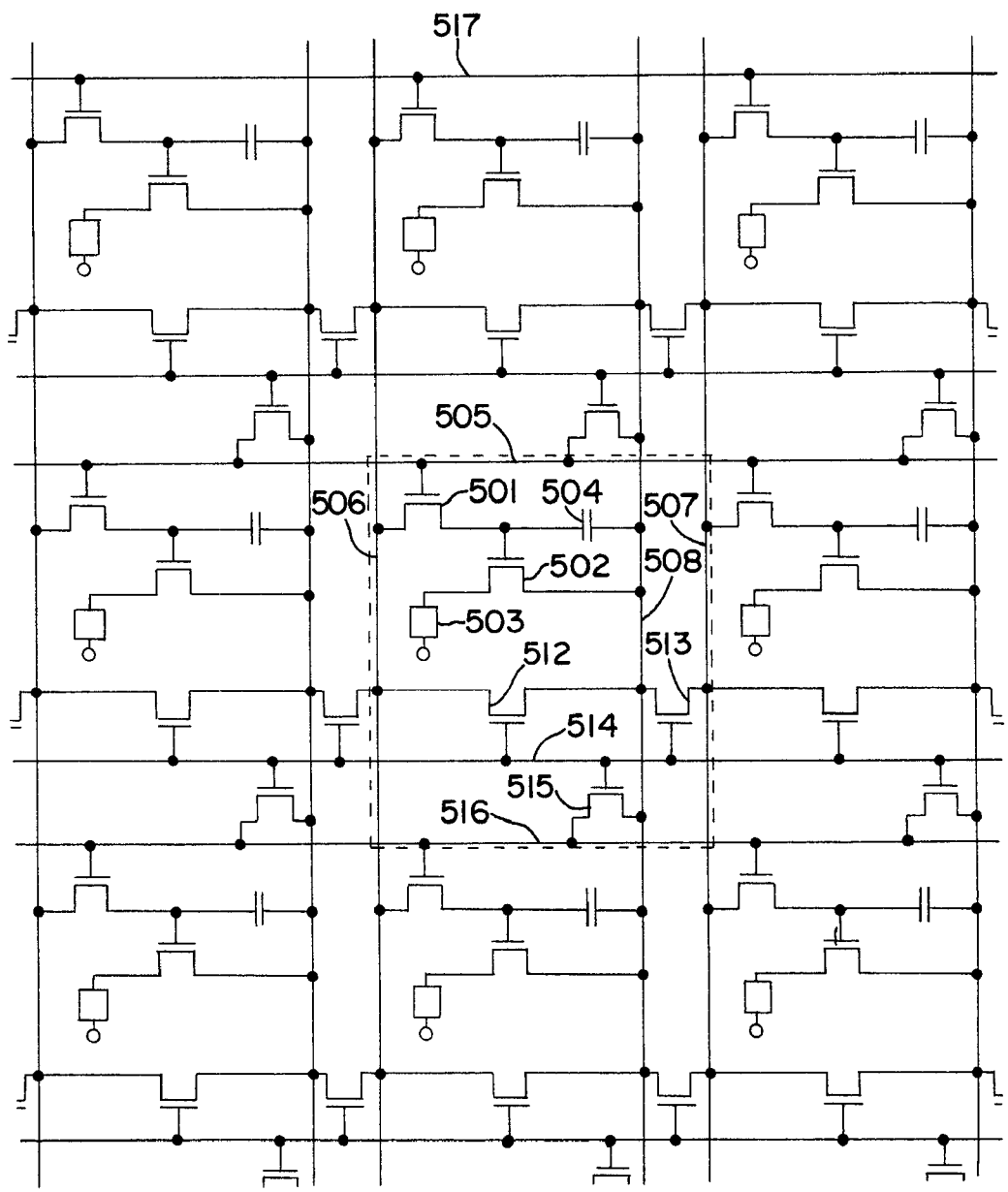
FIG. 5 is an example of a circuit structure for explaining an application to the EL display shown in Embodiment 1.

A circuit diagram for a case of connecting an electric current supply line 508 to both a source signal line 506 and a gate signal line 516 is shown in FIG. 5. The electric current supply line 508 is connected to the gate signal line 516, which is connected to a lower pixel, but of course it may also be connected to a gate signal line 505 in its own pixel, and it may also be connected to a gate signal line 517 of an upper pixel.

Figure 6:
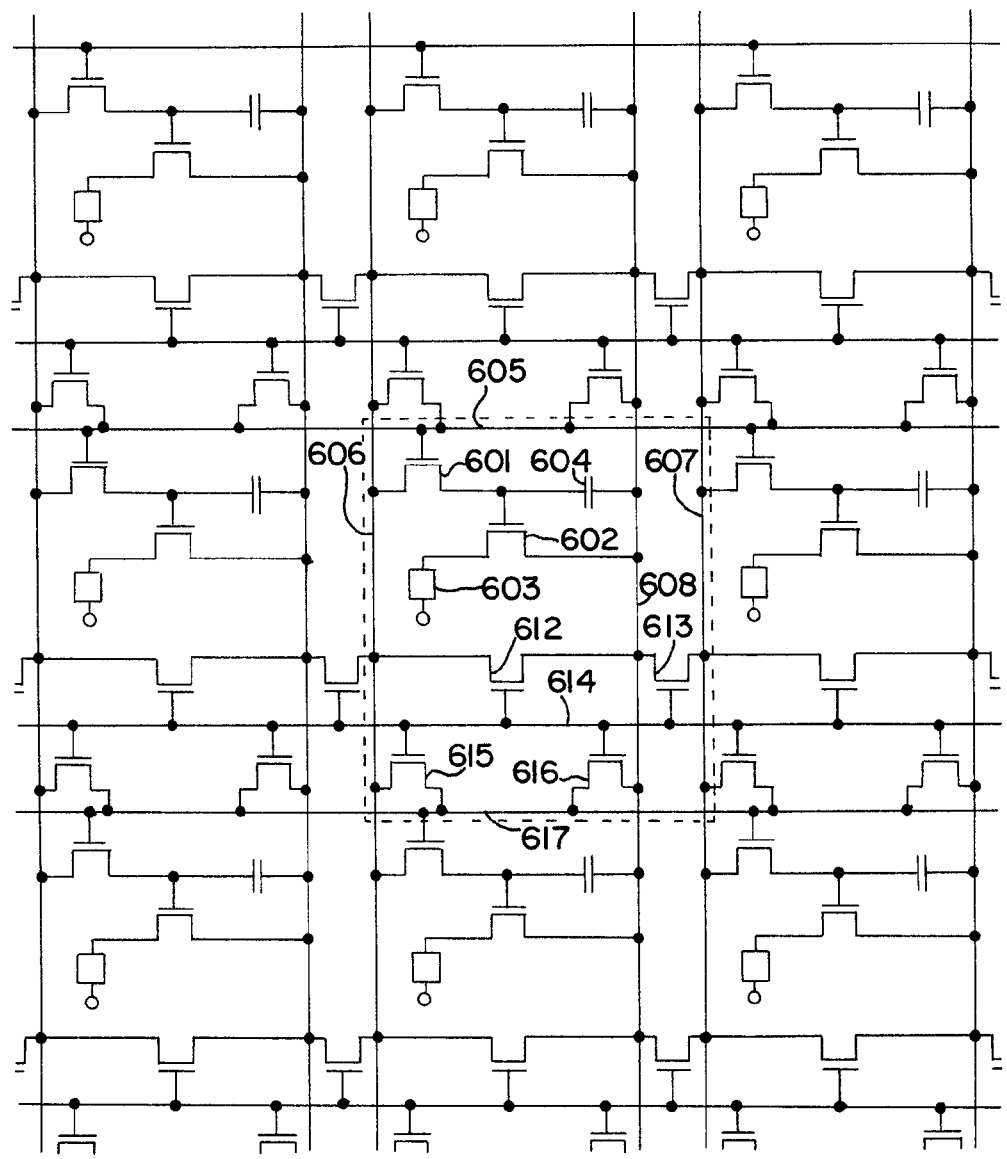
FIG. 6 is an example of a circuit structure for explaining an application to the EL display shown in Embodiment 1.

A circuit diagram is shown in FIG. 6 for a case in which a source signal line 606 and a gate signal line 617 are connected by adding an additional selection TFT 615. From the standpoint of reducing the wiring resistance and increasing the number of paths for electric current to flow in the EL element 603, the circuit structure example shown in FIG. 6 can be said to be ideal. On the other hand, the number of connection TFTs increases, and therefore this structure has the drawback of lowering the aperture ratio. It is necessary to consider an optimal structure which takes into account a balance of all factors. When designing while favoring the aperture ratio of the pixel portion, the structures shown in FIGS. 2 and 3 which have a small number of connection TFTs may be used, and when favoring an increase in electric current pathways, the structures shown in FIGS. 5 and 6, in which each signal line is connected to another signal line through a connection TFT, may be used.

Figure 7:
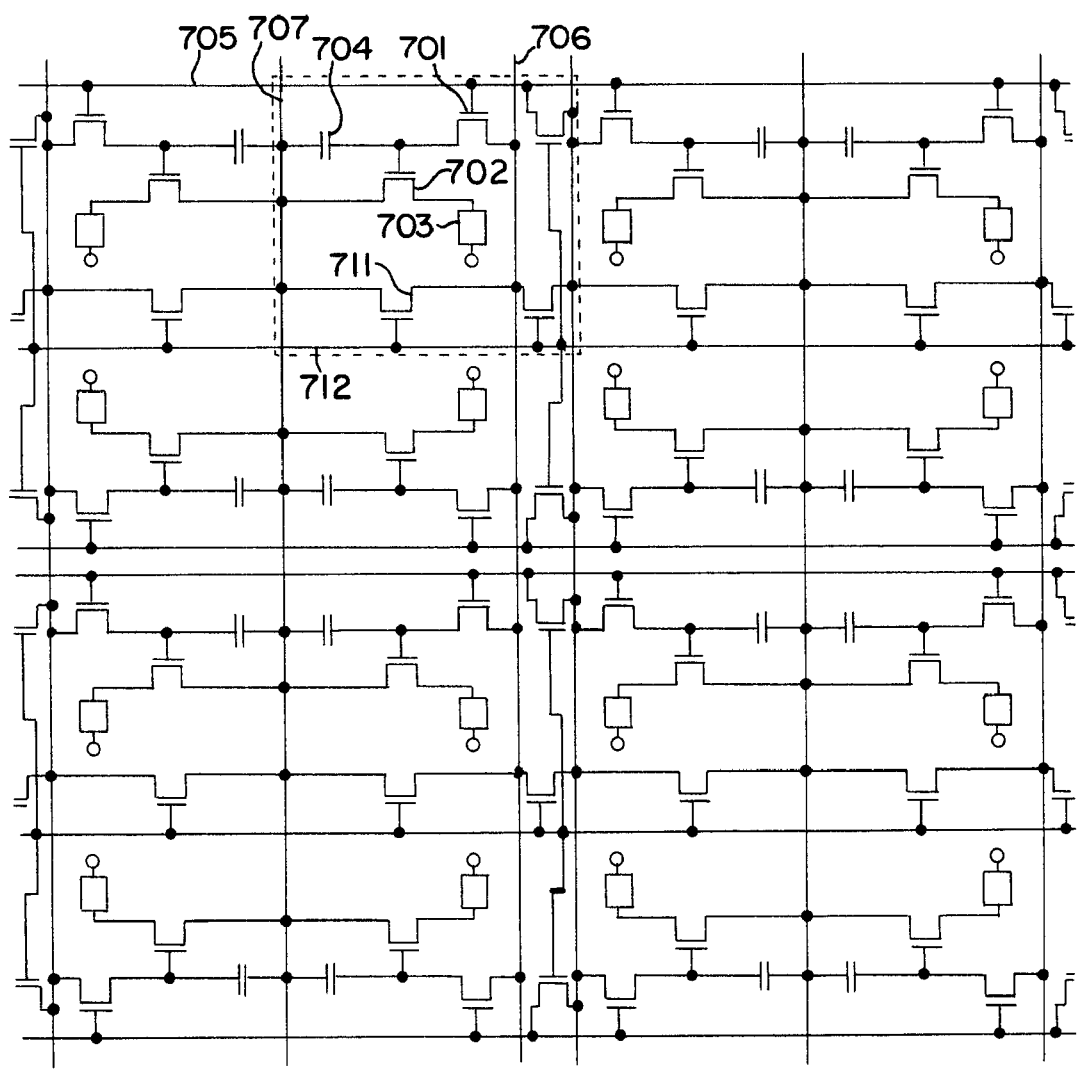
FIG. 7 is an example of a circuit structure for explaining an application to the EL display shown in Embodiment 1.

A circuit diagram for a case of making an electric current supply line 707 and a connection control line 712 common between upper and lower, and between left and right pixels and connecting the electric current supply line 707 and a source signal line 706, and the source signal line 706 and a gate signal line 705 shown in FIG. 7.

Gate signal lines are included in the wirings connected to the electric current supply lines for the examples shown in FIGS. 5 to 7. It is therefore preferable to use p-channel TFTs for the switching TFTs.

P-channel TFTs are used for the connection TFTs with the example circuit structures of FIGS. 5 to 7, but n-channel TFTs may also be used. However, the electric potential of wirings such as the electric current supply line, the source signal line, and the gate signal line becomes higher when the connection TFT is placed in a conducting state. If an n-channel connection TFT is used in that state, then it is necessary to apply an even higher electric potential for the gate voltage when the connection TFT is conductive, and therefore worries develop relating to such as the TFT voltage resistance characteristics, and to reliability. It is therefore preferable to use p-channel TFTs for the connection TFTs for this type of case.

Figure 8:
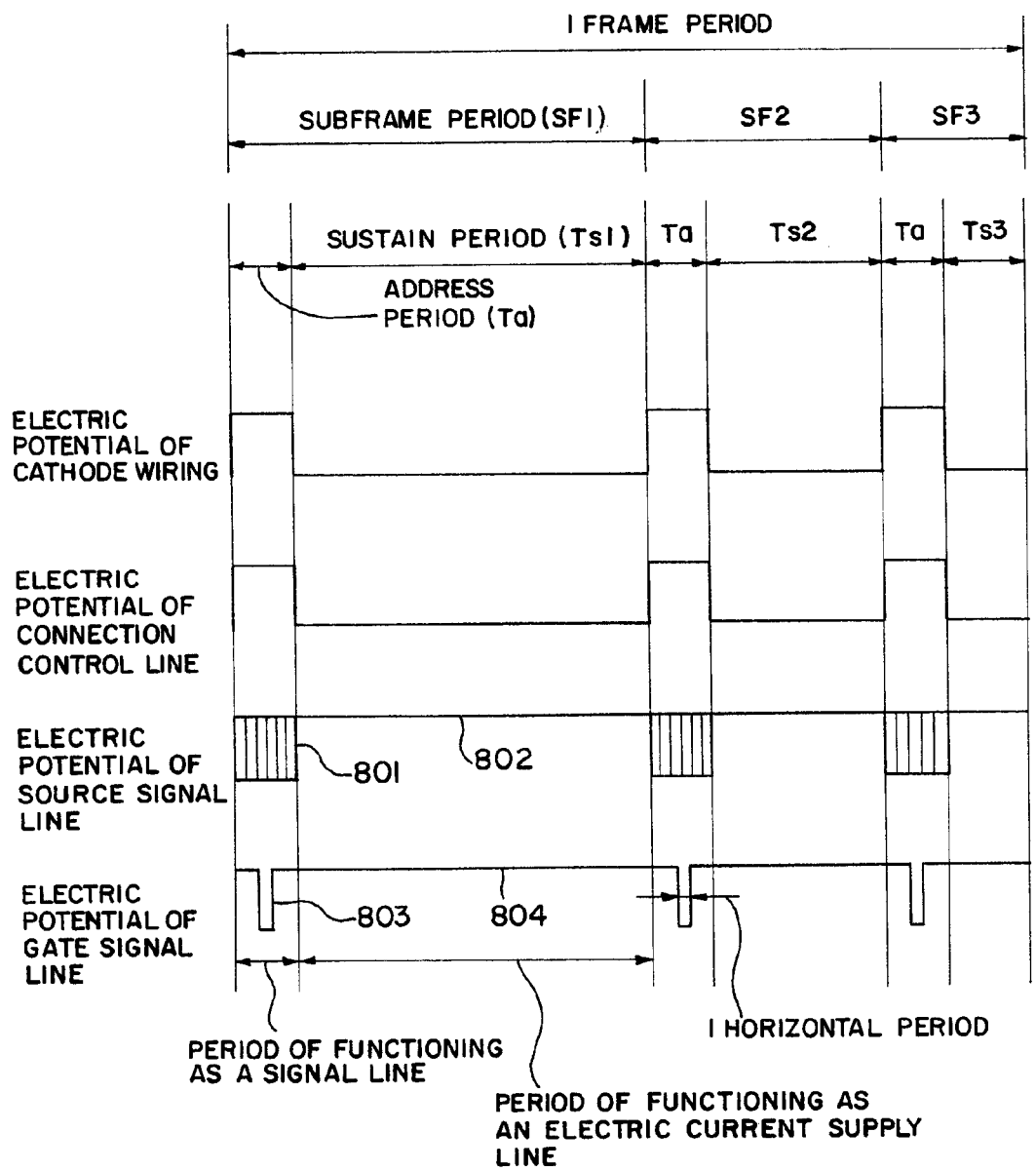
FIG. 8 is a timing chart for explaining a method of driving a circuit shown in Embodiment 1.

Signal timing charts are shown next. FIG. 8 is a timing chart based on a method of driving when each subframe period is separated into an address (write in) period and a sustain (turn on) period. The circuits shown in FIG. 1 may be used, and therefore the reference numerals shown in FIG. 1 are used here.

The connection control line 114 places the connection TFTs 111, 112, and 113 connected to all pixels into a conducting state simultaneous with the start of the sustain (turn on) period. A voltage signal of the connection control line 114 is shown in FIG. 8 for a case in which the connection TFTs are p-channel TFTs. The voltage signal of a source signal line 106 of a certain column is shown below. During the address (write in) period, the source signal line 106 takes on various electric potential values in accordance with an image signal (see reference numeral 801). Then, when the sustain (turn on) period is entered, the source signal line 106 is fixed to the same electric potential as that of the electric current supply line 107 (see reference numeral 802), and functions as a portion of the electric current supply line. A voltage signal of the gate signal line 105 of a certain row is shown below. The gate signal line becomes a low electric potential within the address (write in) period only during one gate signal line selection period for selecting that row (see reference numeral 803). The gate signal line is fixed to the same electric potential as that of the electric current supply line 107 when the sustain (turn on) period starts (see reference numeral 804).

Figure 9:
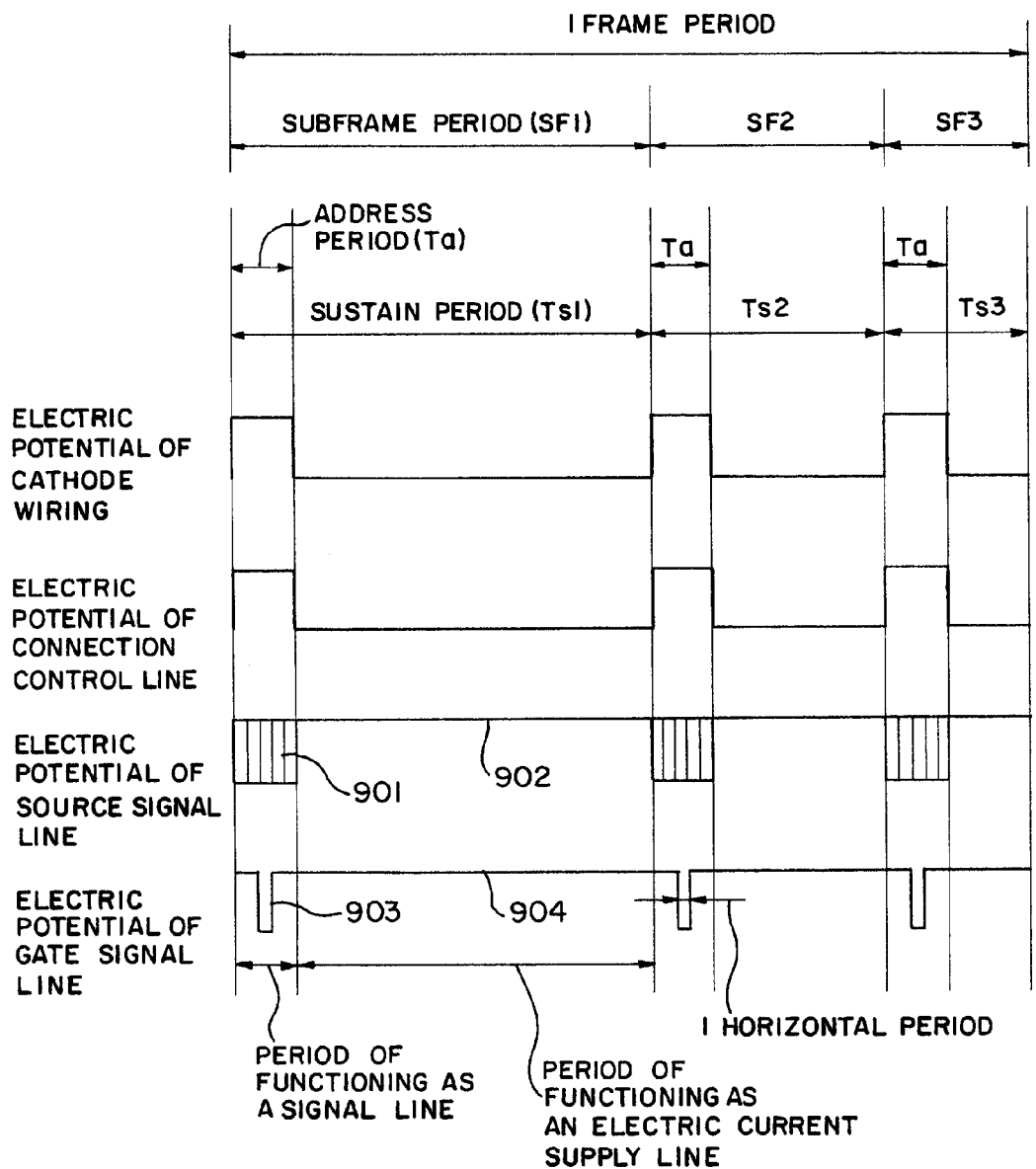
FIG. 9 is a timing chart for explaining a method of driving a circuit shown in Embodiment 1.

FIG. 9 is a timing chart based on a method of driving when the address (write in) period and the sustain (turn on) period are not separated. The circuits shown in FIG. 1 may be used, and therefore the reference numerals shown in FIG. 1 are used here.

The connection control line 114 places the TFTs 111, 112, and 113 connected to all pixels into a conducting state at the same time the address (write in) period is completed and the sustain (turn on) period begins. A voltage signal of the connection control line 114 is shown in FIG. 9 for a case in which the connection TFTs are p-channel TFTs. The voltage signal of a source signal line 106 of a certain column is shown below. During the address (write in) period, the source signal line 106 takes on various electric potential values in accordance with an image signal (see reference numeral 901). Then, when the address (write in) period is completed and the sustain (turn on) period is entered, the source signal line 106 is fixed to the same electric potential as that of the electric current supply line 107 (see reference numeral 902), and functions as a portion of the electric current supply line. A voltage signal of the gate signal line 105 of a certain row is shown below. The gate signal line becomes a low electric potential within the address (write in) period only during one gate signal line selection period for selecting that row (see reference numeral 903). The gate signal line is fixed to the same electric potential as that of the electric current supply line 107 when the address (write in) period is completed and the sustain (turn on) period starts (see reference numeral 904).

Note that the timing charts shown in FIGS. 8 and 9 are examples of cases in which the switching TFTs, the EL driver TFTs, and the connection TFTs are p-channel TFTs. If the TFTs have differing polarities, then it is necessary to invert the electric potentials so as to match the differing polarities.

An example in which the electric potential of the electric current supply lines 107 of all pixels is the same is explained in Embodiment 1. However, if a color EL display, in which the three colors RGB are separated, is used, then there are cases in which the voltage applied to the EL elements 103 is changed depending upon color in order to have identical brightness levels with the three colors RGB.

Figure 10:
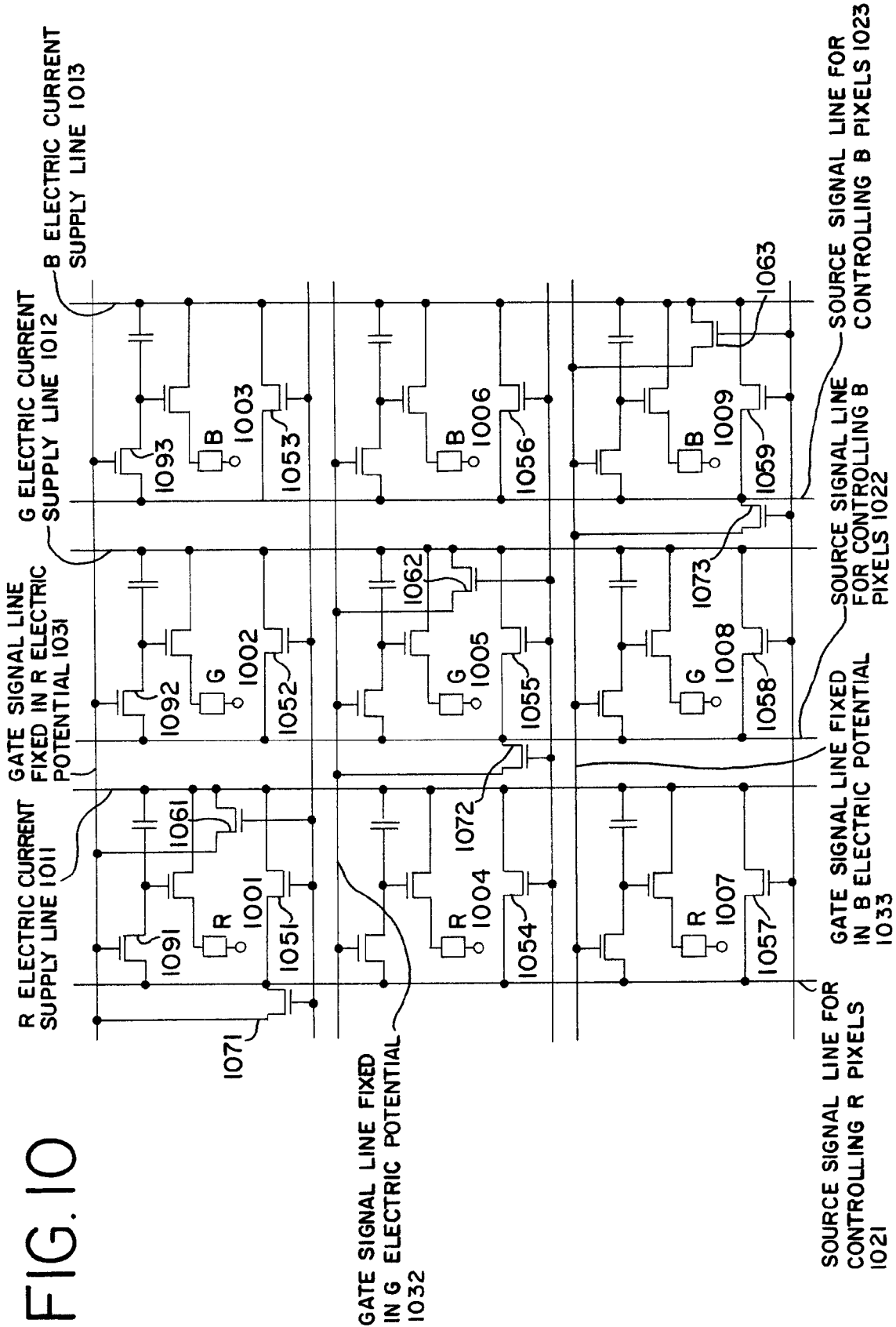
FIG. 10 is an example of a circuit structure for explaining an application to a color EL display shown in Embodiment 1.

FIG. 10 is an example of implementing a structure of the present invention in a pixel portion of a three color RGB color EL display. Three colors R, G, and B are noted next to EL elements in FIG. 10.

It is necessary to apply differing voltage for each of the three colors, and therefore it is necessary to prepare electric current supply lines having three types of electric potentials. The structure of FIG. 10 is the easiest arrangement, and can be implemented with a few wirings, and therefore is preferable when considering that one electric current supply line is connected to pixels emitting the same color light in arranging the pixels. An electric current supply line 1011 having an R electric potential is connected with pixels 1001, 1004, and 1007, which display R. An electric current supply line 1012 having G electric potential is connected with pixels 1002, 1005, and 1008, which display G, and an electric current supply line 1013 having B electric potential is connected with pixels 1003, 1006, and 1009, which display B.

Further, regarding source signal lines 1021, 1022, and 1023, provided that they are arranged in accordance with the electric potential of the electric current supply lines which are adapted to the display color of the pixels to which they are connected, the source signal lines 1021, 1022, and 1023 can be connected to the electric current supply lines through connection TFTs 1051 to 1059 within the same pixel.

As an example of a case of using gate signal lines 1031, 1032, and 1033 as electric current supply lines with this structure, the gate signal lines may be connected to other wirings through connection TFTs only in pixels corresponding with the voltages, as shown in FIG. 10. The electric potential when the gate signal line 1031 functions as an electric current supply line is the same electric potential as that of the R electric current supply line 1011, and therefore the gate signal line 1031 is connected to the R electric current supply line 1011 and to the source signal line 1021 for controlling the R pixel through connection TFTs 1061 and 1071, respectively. The electric potential when the gate signal line 1032 functions as an electric current supply line is the same electric potential as that of the G electric current supply line 1012, and therefore the gate signal line 1032 is connected to the G electric current supply line 1012 and to the source signal line 1022 for controlling the G pixel through connection TFTs 1062 and 1072, respectively. In addition, the electric potential when the gate signal line 1033 functions as an electric current supply line is the same electric potential as that of the B electric current supply line 1013, and therefore the gate signal line 1033 is connected to the B electric current supply line 1013 and to the source signal line 1023 for controlling the B pixels through connection TFTs 1063 and 1073, respectively.

Further, although a connection example for only a 3×3 pixel range is shown in FIG. 10, provided that signal lines have the same electric potential, wirings may be drawn from the outside of the range shown in FIG. 10, and connections between the respective signal lines may be made.

Conditions for implementing the present invention in a color display electronic device as shown in FIG. 10 are discussed here.

Consider the state of the three pixels having the EL elements 1001, 1002, and 1003 in FIG. 10. Assume that the connection TFTs 1051 to 1053 and 1071 are conductive, and the signal lines function as electric current supply lines in the sustain (turn on) period.

When the electric potential of the R electric current supply line is $V_{CUL(R)}$, the electric potential of the G electric current supply line is $V_{CUL(G)}$, and the electric potential of the B electric current supply line is $V_{CUL(B)}$, the electric potential of each of the source signal lines 1021 to 1023 becomes the same electric potential as the respective electric current supply lines due to the connection TFTs 1051 to 1053 being conductive.

Taking the voltage between a gate and a source of a switching TFT 1091 as $V_{GS(R)}$, the voltage between a gate and a source of the switching TFT 1092 as $V_{GS(G)}$, and the voltage between a gate and a source of the switching TFT 1093 as $V_{GS(B)}$ at this time, the gate signal line 1031 becomes the same electric potential as the R electric current supply line, and therefore $|V_{GS(R)}|=0$, $|V_{GS(G)}|=|V_{CUL(R)}-V_{CUL(G)}|$, and $|V_{GS(B)}|=|V_{CUL(R)}-V_{CUL(B)}|$.

The period during which the connection TFTs are conductive is within the sustain (turn on) period, and therefore it is necessary for the switching TFTs to be in a non-conducting state. Namely, both $|V_{GS(G)}|$ and $|V_{GS(B)}|$ must be lower than the absolute value of the threshold voltage of the switching TFTs $|V_{th}|$. In other words, dispersion in the determined electric potential of the electric current supply lines must be set smaller than the threshold voltage of the switching TFTs so that the EL elements for emitting light of each color will have the same brightness. Otherwise, the switching TFT 1092 or the switching TFT 1093 will be conductive even within the sustain (turn on) period, and there will be malfunctions.

It is therefore possible to use the gate signal lines as electric current supply lines in a color display electronic device, provided that the above conditions are satisfied.

It is possible to use the gate signal lines as electric current supply pathways even sustain (turn on) periods which overlap with the address (write in) periods, provided that only the electric current supply lines and the gate signal lines are electrically connected through the connection TFTs.

Figure 20:
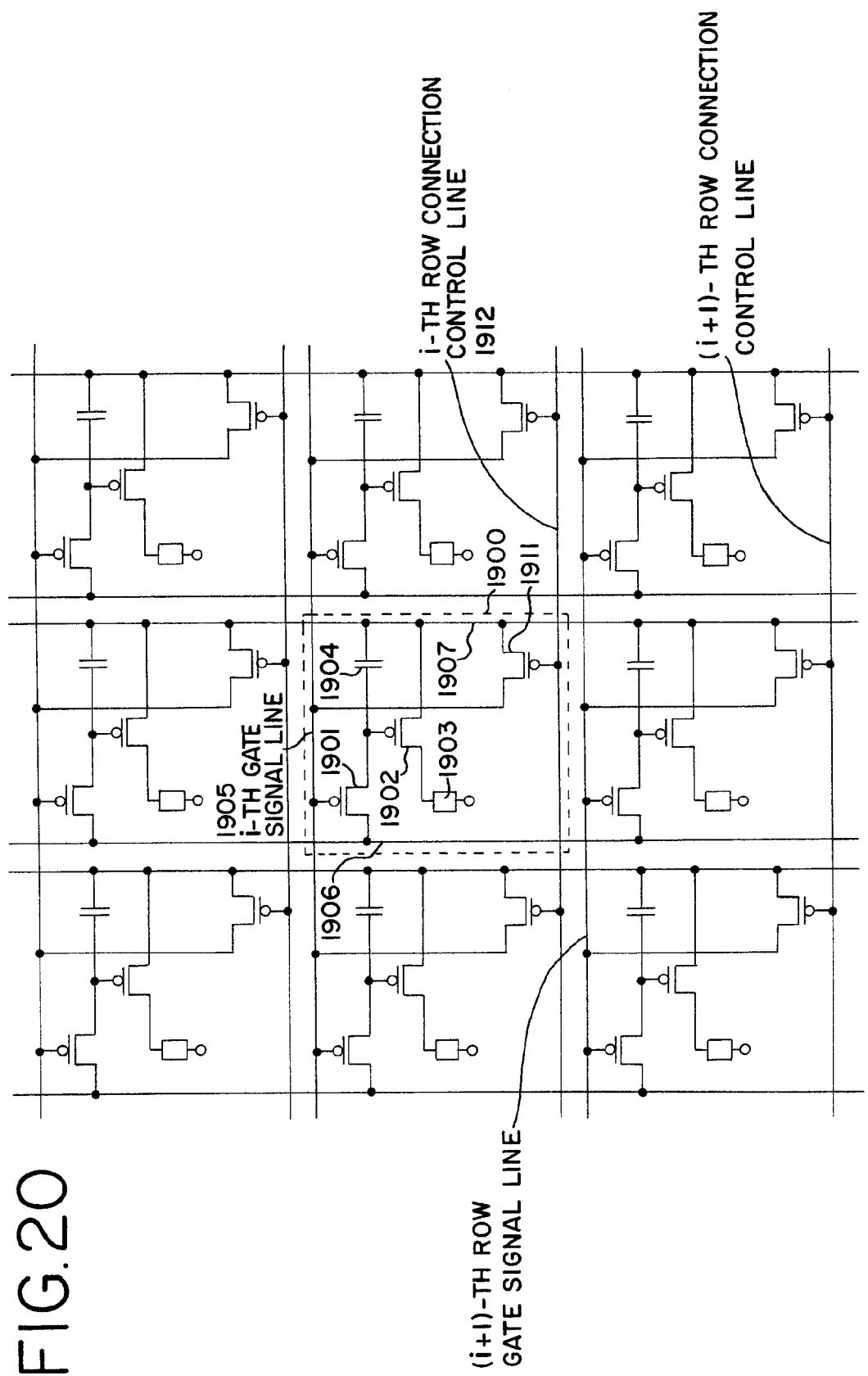
FIG. 20 is an example of a circuit structure for explaining an application to an EL display shown in Embodiment 1.
Figure 21:
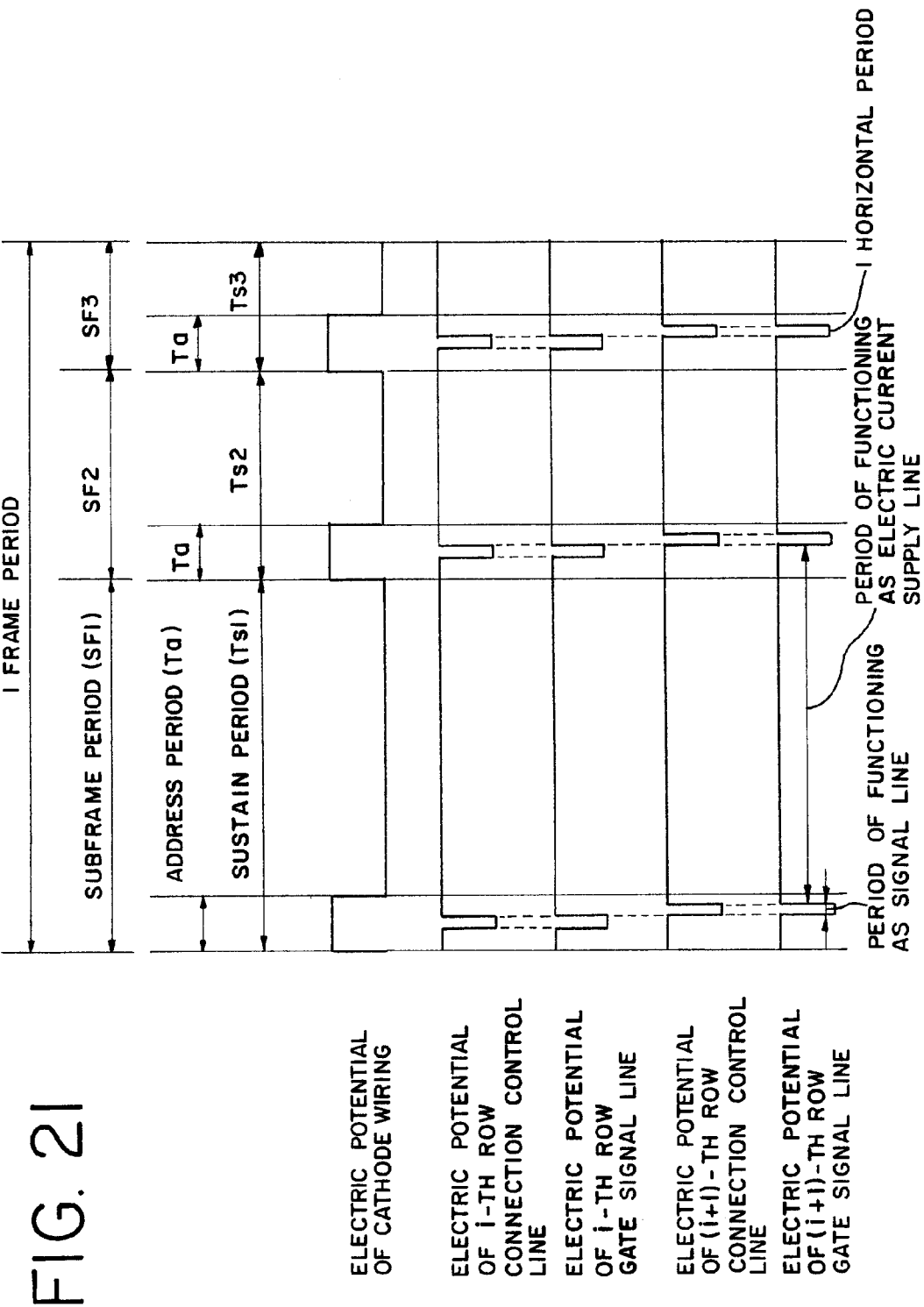
FIG. 21 is a timing chart for explaining a method of driving a circuit shown in Embodiment 1.

An explanation is made with reference to FIGS. 20 and 21. An electric current supply line 1907 and a gate signal line 1905 are electrically connected through a connection TFT 1911. The gate signal line 1905 is taken as a number i row gate signal line. The electric current supply line is made conductive only during a period in which the number i row gate signal line 1905 is unselected, and the gate signal line can be used as an electric current supply pathway. With the timing charts shown in FIGS. 8 and 9, the identical signal is input to all of the connection control lines, and the connection TFTs are controlled to be ON or OFF at identical timings. In this case, however, a signal is input to the connection control line of each column at a timing which is the same as that of the gate signal line electrically connected to one of a source region and a drain region of the connection TFT, the connection TFT itself electrically connecting the connection control line and a gate electrode. In other words, in FIG. 20 at the same time as the gate signal line 1905 is selected, the electric potential of a connection control line 1912 changes, and the connection TFT 1911 is placed in a non-conducting state. Then, at the same time as the gate signal line 1905 is returned to a non-selected state, the electric potential of the connection control line 1912 changes, and the connection TFT 1911 becomes conductive. It thus becomes possible to use the gate signal lines as electric current supply pathways even during the sustain (turn on) periods which overlap with the address (write in) periods. Note that it is also possible to apply this method to a method of driving by an analog gray scale method.

A case in which the gate signal line and the electric current supply line are made conductive within one pixel is shown in the example of FIGS. 20 and 21, but gate signal lines and electric current supply lines of other rows may also be connected. In this case, it is necessary to input signal to the connection control lines so that the electric current supply lines are not conductive during periods when the gate signal lines are selected.

Note that the timing chart shown in FIG. 21 is an example of a case in which the switching TFTs are p-channel TFTs, the EL driver TFTs are p-channel TFTs, and the connection TFTs are n-channel TFTs. It is necessary to invert the corresponding electric potentials for a case of using TFTs having differing polarities.

Embodiment 2

A method of manufacturing TFTs of a driver circuit (such as a source signal line driver circuit or a gate signal line driver circuit) provided in the periphery of a pixel portion, and switching TFTs and EL driver TFTs of the pixel portion on the same substrate is explained in detail as a method of manufacturing the electronic device explained by Embodiment 1 in accordance with steps. Note that, in order to simplify the explanation, a CMOS circuit, a basic structure circuit, is shown as a driver circuit portion, and a switching TFT and an EL driver TFT are shown as EL driver TFTs.

Figure 11A:
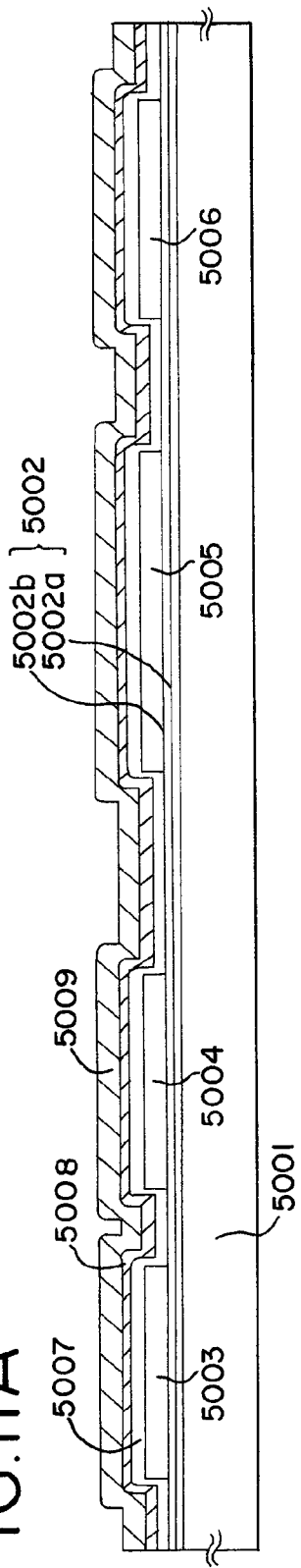
FIGS. 11A to 11C are diagrams showing an example of a method of manufacturing an electronic device shown in Embodiment 2.

First, as shown in FIG. 11A, a base film 5002 made of an insulating film such as a silicon oxide film, a silicon nitride film, or a silicon oxynitride film is formed on a substrate 5001 made from glass, such as barium borosilicate glass or aluminum borosilicate glass, typically Coming Corp. #7059 glass or #1737 glass. For example, a silicon oxynitride film 5002a manufactured from $SiH_4$, $NH_3$, and $N_2O$ by plasma CVD is formed with a thickness of 10 to 200 nm (preferably from 50 to 100 nm), and a hydrogenized silicon oxynitride film 5002b with a thickness of 50 to 200 nm (preferably between 100 and 150 nm), manufactured from $SiH_4$ and $N_2O$, is similarly formed and laminated. The base film 5002 with the two layer structure is shown in Embodiment 2, but the base film 5002 may also be formed as a single layer of one of the above insulating films, and it may be formed having a lamination structure in which two or more layers are laminated.

Island shape semiconductor layers 5003 to 5006 are formed of crystalline semiconductor film manufactured by using a laser crystalline method or a known thermal crystallization method with a semiconductor film having an amorphous structure. The thickness of the island shape semiconductor layers 5003 to 5006 is set from 25 to 80 nm (preferably between 30 and 60 nm). There are no limitations on the crystalline semiconductor film material, but it is preferable to form the film from a semiconductor material such as silicon or a silicon germanium (SiGe) alloy.

A laser such as a pulse oscillation type or continuous emission type excimer laser, a YAG laser, or a $YVO_4$ laser can be used as a laser light source in manufacturing the crystalline semiconductor film with the laser crystallization method. A method of condensing laser light emitted from a laser oscillator into a linear shape by an optical system and then irradiating the light to the semiconductor film may be employed when these types of lasers are used. The crystallization conditions may be suitably selected by the operator. However, the pulse oscillation frequency is set to 30 Hz, and the laser energy density is set form 100 to 400 $mJ/cm^2$ (typically between 200 and 300 $mJ/cm^2$) when using the excimer laser. Further, the second harmonic is utilized when using the YAG laser, the pulse oscillation frequency is set from 1 to 10 KHz, and the laser energy density may be set from 300 to 600 $mJ/cm^2$ (typically between 350 and 500 $mJ/cm^2$). The laser light which has been condensed into a linear shape with a width of 100 to 1000 $\mu$m, for example 400 $\mu$m, is then irradiated onto the entire surface of the substrate. This is performed with an overlap ratio of 80 to 98% for the linear laser light.

A gate insulating film 5007 is formed covering the island shape semiconductor layers 5003 to 5006. The gate insulating film 5007 is formed of an insulating film containing silicon a thickness of 40 to 150 nm by plasma CVD or sputtering. A 120 nm thick silicon oxynitride film is formed in Embodiment 2. The gate insulating film is not limited to this type of silicon oxynitride film, of course, and other insulating films containing silicon may also be used, in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHz) electric power density of 0.5 to 0.8

W/cm². Good characteristics as a gate insulating film can be obtained by subsequently performing thermal annealing, at between 400 and 500° C., of the silicon oxide film thus manufactured.

A first conductive film 5008 and a second conductive film 5009 are then formed on the gate insulating film 5007 in order to form gate electrodes. The first conductive film 5008 is formed from Ta with a thickness of 50 to 100 nm, and the second conductive film 5009 is formed by W with a thickness of 100 to 300 nm, in Embodiment 2.

The Ta film is formed by sputtering, and sputtering with a Ta target is performed by using Ar. If appropriate amounts of Xe and Kr are added to the Ar during sputtering, the internal stress of the Ta film will be relaxed, and film peeling can be prevented. The resistivity of an a phase Ta film is on the order of 20 $\mu\Omega$cm, and it can be used in the gate electrode, but the resistivity of a α phase Ta film is on the order of 180 $\mu\Omega$cm and it is unsuitable for the gate electrode. The a phase Ta film can easily be obtained if a tantalum nitride film, which possesses a crystal structure near that of α phase Ta, is formed with a thickness of 10 to 50 nm as a base for Ta in order to form the α phase Ta film.

A W film is formed by sputtering with a W target. The W film can also be formed by thermal CVD using tungsten hexafluoride ($WF_6$). Whichever is used, it is necessary to make the film become low resistance in order to use it as the gate electrode, and it is preferable that the resistivity of the W film be made equal to or less than 20 $\mu\Omega$cm. The resistivity can be lowered by enlarging the crystals of the W film, but for cases in which there are many impurity elements such as oxygen within the W film, crystallization is inhibited, and the film becomes high resistance. A W target having a purity of 99.9999% is thus used in sputtering. In addition, the W film is formed while sufficient care is taken in order that no impurities from within the gas phase are introduced at the time of film formation. Thus, a resistivity of 9 to 20 $\mu\Omega$cm can be achieved.

Note that, although the first conductive film 5008 is Ta and the second conductive film 5009 is W in Embodiment 2, the conductive films are not limited to these. Both the first conductive film 5008 and the second conductive film 5009 may also be formed from an element selected from the group consisting of Ta, W, Ti, Mo, Al, and Cu, from an alloy material having one of these elements as its main constituent, or from a chemical compound of these elements. Further, a semiconductor film, typically a polysilicon film, into which an impurity element such as phosphorous is doped may also be used. Examples of preferable combinations other than that used in Embodiment 2 include: a combination of the first conductive film formed from tantalum nitride (TaN) and the second conductive film formed from W; a combination of the first conductive film formed from tantalum nitride (TaN) and the second conductive film formed from Al; and a combination of the first conductive film formed from tantalum nitride (TaN) and the second conductive film formed from Cu. Particularly, the conductive film 5008 and the second conductive film 5009 may be preferably formed using the combination that can obtain selectivity by etching (See FIG. 11A.)

A mask 5010 is formed next from resist, and a first etching process is performed in order to form electrodes and wirings. An ICP (inductively coupled plasma) etching method is used in Embodiment 2. A gas mixture of $CF_4$ and $Cl_2$ is used as an etching gas, and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias. The W film and the Ta film are both etched on the same order when $CF_4$ and $Cl_2$ are combined.

Edge portions of the first conducting layer and the second conducting layer are made into a tapered shape in accordance with the effect of the bias voltage applied to the substrate side with the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 5011 to 5016 (first conductive layers 5011*a* to 5016*a* and second conductive layers 5011*b* to 5016*b*) composed of the first conducting layer and the second conducting layer are thus formed by the first etching process. Portions of the gate insulating film 5007 not covered by the first shape conductive layers 5011 to 5016 are etched on the order of 20 to 50 nm, forming thinner regions.

A first doping process is then performed, and an impurity element which imparts n-type conductivity is added. Ion doping or ion injection may be performed as the doping method. Ion doping is performed at conditions in which the dosage is set to $1\times10^{13}$ to $5\times10^{14}$ atoms/cm², and an acceleration voltage is set between 60 and 100 keV. An element residing in group 15 of the periodic table, typically phosphorous (P) or arsenic (As), is used as the n-type conductivity imparting impurity element. Phosphorous (P) is used here. The conductive layers 5011 to 5015 become masks with respect to the n-type conductivity imparting impurity element, and first impurity regions 5017 to 5025 are formed in a self-aligning manner. The impurity element which imparts n-type conductivity is added to the first impurity regions 5017 to 5025 at a concentration within a range of $1\times10^{20}$ and $1\times10^{21}$ atoms/cm³. (See FIG. 11B.)

A second etching process is performed next. The ICP etching method is similarly used; a mixture of $CF_4$, $Cl_2$, and $O_2$ is used as the etching gas, and a plasma is generated by supplying a 500 W RF electric power (13.56 MHz) to a coil shape electrode at a pressure of 1 Pa. A 50 W RF electric power (13.56 MHz) is applied to the substrate side (test piece stage), and a self-bias voltage which is lower in comparison with the first etching process is applied. The W film is etched anisotropically under these etching conditions, and Ta (the first conductive layers) is anisotropically etched at a slower etching speed, forming second shape conductive layers 5026 to 5031 (first conductive layers 5026*a* to 5031*a* and second conductive layers 5026*b* to 5031*b*). The gate insulating film 5007 is additionally etched on the order of 20 to 50 nm, forming thinner regions, in regions not covered by the second shape conductive layers 5026 to 5031. (See FIG. 11C.)

The etching reaction of the W film or the Ta film in accordance with the mixed gas of $CF_4$ and $Cl_2$ can be estimated from the generated radicals, or from the ion species and vapor pressures of the reaction products. Comparing the vapor pressures of W and Ta fluorides and chlorides, the W fluoride compound $WF_6$ is extremely high, and the vapor pressures of $WCl_5$, $TaF_5$, and $TaCl_5$ are of similar order. Therefore the W film and the Ta film are both etched by the $CF_4$ and $Cl_2$ gas mixture. However, if a suitable quantity of $O_2$ is added to this gas mixture, $CF_4$ and $O_2$ react, forming CO and F, and a large amount of F radicals or F ions are generated. As a result, the etching speed of the W film having a high fluoride vapor pressure becomes high. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. It therefore becomes possible to have a difference in etching speeds of the W film and the Ta film, and it becomes possible to make the etching speed of the W film larger than that of the Ta film.

A second doping process is then performed as shown in FIG. 12A. In this case, an impurity element which imparts n-type conductivity is doped under conditions of a lower dosage than that in the first doping process, and at a higher acceleration voltage than that in the first doping process. For example, doping may be performed at an acceleration voltage of 70 to 120 keV and with a dosage of $1 \times 10^{13}$ atoms/$cm^2$, forming new impurity regions inside the first impurity regions formed in the island shape semiconductor layers of FIG. 11B. Doping is performed with the second shape conductive layers 5026 to 5030 as masks with respect to the impurity element, and doping is done such that the impurity element is also added to regions below the first conductive layers 5026a to 5030a. Third impurity regions 5032 to 5041, which overlap with the first conductive layers 5026a to 5030a, and second impurity regions 5042 to 5051 between the first impurity regions and the third impurity regions are thus formed. The n-type conductivity imparting impurity element is added at a concentration of $1 \times 10^{17}$ to $1 \times 10^{19}$ atoms/cm in the second impurity regions, and at a concentration of $1 \times 10^{16}$ to $1 \times 10^{18}$ atoms/$cm^3$ in the third impurity regions.

Then, as shown in FIG. 12B, fourth impurity regions 5052 to 5074, having a conductivity type opposite to the single conductivity type, are formed in the island shape semiconductor layers 5004, 5005, and 5006, which form p-channel TFTs. The second conductive layers 5012 to 5015 are used as masks against the impurity element, and the impurity regions are formed in a self-aligning manner. The island shape semiconductor layer 5003 which forms an n-channel TFT, and the second conducting layer 5031 which forms a wiring, have their entire surfaces covered by a resist mask 5200 at this point. Phosphorous is added at differing concentrations to the impurity regions 5052 to 5054, 5055 to 5057, 5058 to 5060, 5061 to 5065, 5066 to 5068, 5069 to 5071, and 5072 to 5074, respectively, by ion doping using diborane ($B_2H_6$). The impurity concentration in all of the regions is set so as to be from $2 \times 10^{20}$ to $2 \times 10^{21}$ atoms/$cm^3$.

The impurity regions are formed in the respective island shape semiconductor layers by the above processes. The second shape conductive layers 5026 to 5030, which overlap with the island shape semiconductor layers, function as gate electrodes. Further, the second shape conducting layer 5031 functions as a signal line.

A process of activating the impurity elements added to the respective island shape semiconductor layers is then performed as shown in FIG. 12C, with the aim of controlling conductivity type. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen environment at 400 to 700° C., typically between 500 and 600° C. Heat treatment is performed for 4 hours at 500° C. in Embodiment 2. However, for cases in which the wiring material used in the second shape layers 5026 to 5030 is weak with respect to heat, it is preferable to perform activation after forming an interlayer insulating film (having silicon as its main constituent) in order to protect the wirings.

In addition, heat treatment is performed for 1 to 12 hours at 300 to 450° C. in an atmosphere containing between 3 and 100% hydrogen, performing hydrogenation of the island shape semiconductor layers. This process is one of terminating dangling bonds in the island shape semiconductor layers by hydrogen which is thermally excited. Plasma hydrogenation (using hydrogen excited by a plasma) may also be performed as another means of hydrogenation.

Figure 13A:
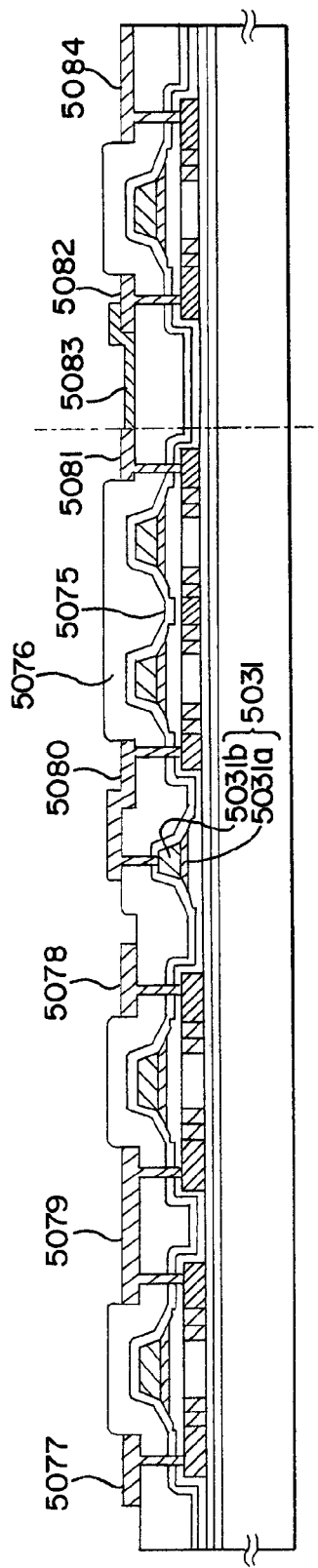
FIGS. 13A and 13B are diagrams showing the example of a method of manufacturing an electronic device shown in Embodiment 2.

A first interlayer insulating film 5075 is formed next, as shown in FIG. 13A. A single layer insulating film containing silicon may be used as the first interlayer insulating film 5075, or a lamination film in which two or more insulating films containing silicon are combined may also be used. Further, the film thickness may be set from 400 nm to 1.5 μm. A 200 nm thick silicon oxynitride film is formed in Embodiment 2. Furnace annealing, laser annealing, or lamp annealing can be performed as a means of activation. Thermal processing is performed in a nitrogen atmosphere for 4 hours at 550° C. using an electric furnace in Embodiment 2.

The first interlayer insulating film fulfills a role of stopping oxidation of the gate electrodes at this point.

In addition, heat treatment is performed for 1 to 12 hours at 300 to 450° C. in an atmosphere containing between 3 and 100% hydrogen to perform hydrogenation. This process is one of terminating dangling bonds in the island shape semiconductor layers by hydrogen which is thermally excited. Plasma hydrogenation (using hydrogen excited by a plasma) may also be performed as another means of hydrogenation.

Note that hydrogenation may also be performed between the formation of one layer and the formation of another layer if a lamination film is used as the first interlayer insulating film 5075.

Figure 13B:
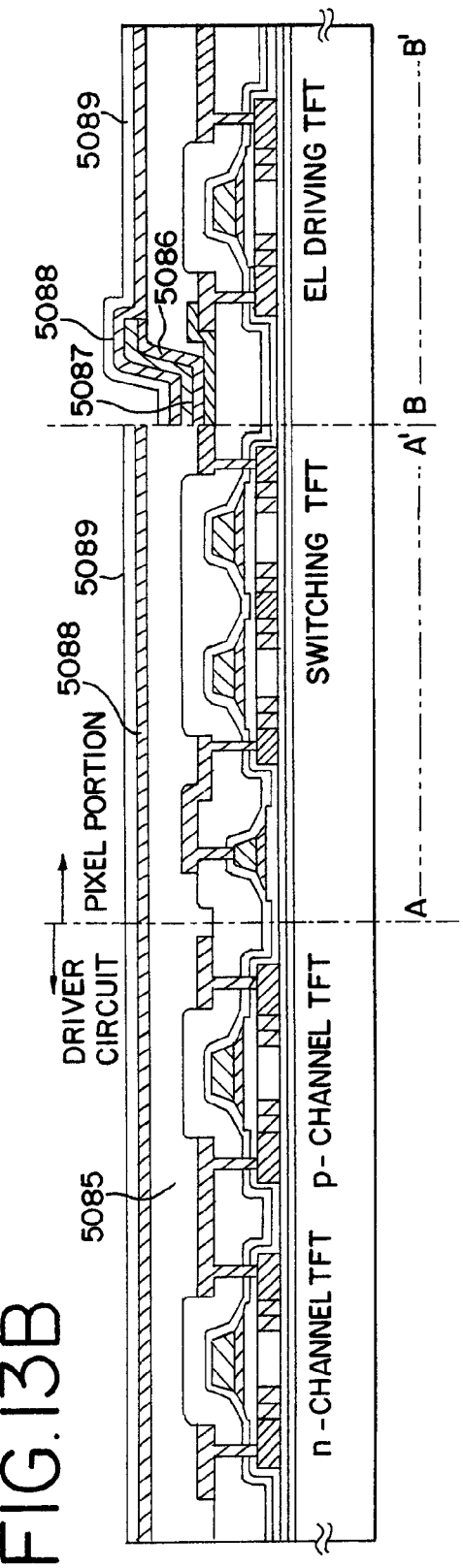

Next, as shown in FIG. 13B, a second interlayer insulating film 5076 is formed after the activation process, and contact holes are formed in the first interlayer insulating film 5075, the second interlayer insulating film 5076, and the gate insulting film 5007. After forming each wiring (including connection electrodes) 5077 to 5082, and a gate signal line 5084, by patterning, a pixel electrode 5083 contacting the connection electrode 5082 is formed by patterning.

An organic resin material is used for the second interlayer insulating film 5076. Organic resins such as polyimide, polyamide, acrylic, and BCB (benzocyclobutene) can be used. In particular, it is preferable to use acrylic, which has superior levelness for the second interlayer insulating film 5076, because it is formed with a strong implication of leveling. An acrylic film is formed in Embodiment 2 at a film thickness at which steps formed by the TFTs can be sufficiently leveled. The film thickness is preferably from 1 to 5 μm (more preferably between 2 and 4 μm).

Formation of the contact holes is done using dry etching or wet etching, and contact holes for reaching the n-type impurity regions 5018 to 5026 and the p-type impurity regions 5054 to 5065, a contact hole for reaching the wiring 5032, a contact hole for reaching the electric current supply line 5033, and contact holes for reaching the gate electrodes 5029 and 5030 (not shown in the figure) are formed.

Further, a three layer structure lamination film, in which a 100 nm thick Ti film, a 300 nm thick Al film containing Ti, and a 150 nm thick Ti film are formed in succession by sputtering and then patterned into a predetermined shape, is used for the wirings (including connection electrodes and signal line) 5077 to 5082, and 5084. Of course, other conductive films may be used.

When manufacturing an electronic device having the pixel of the present invention, gate signal lines are formed utilizing a portion of the three layer structure lamination film, and the gate signal lines are to be used as temporary electric current supply lines, and therefore it is preferable to use a material having low resistance (for example, a material having a low resistance material such as aluminum or copper as its main constituent).

An indium oxide tin oxide (ITO) film is formed as the pixel electrode 5083 with a thickness of 110 nm in Embodiment 2, and patterning is then performed. The contact is attained such that the pixel electrode 5083 is arranged so as to contact and overlap with the connection electrode 5082. Further, a transparent conductive film in which between 2 and 20% zinc oxide (ZnO) is mixed with indium oxide may also be used. The pixel electrode 5083 becomes an anode of an EL element.

Next, as shown in FIG. 13B, an insulating film containing silicon (a silicon oxide film in Embodiment 2) is formed with a thickness of 500 nm, an open portion is formed in a location corresponding to the pixel electrode 5083, and a third interlayer insulating film 5085 is formed. Sidewalls can easily be formed into a tapered shape by using wet etching when forming the open portion. If the sidewalls of the open portion are not sufficiently gentle, then there is a conspicuous problem in which the EL layers degrade due to the step.

An EL layer 5086 and a cathode (MgAg electrode) 5087 are formed next in succession, without exposure to the atmosphere, using vacuum evaporation. Note that the film thickness of the EL layer 5086 may be set from 80 to 200 nm (typically between 100 and 120 nm), and the thickness of the cathode 5087 may be set from 180 to 300 nm (typically 200 to 250 nm).

The EL layer and the cathode are formed one after another with respect to pixels corresponding to the color red, pixels corresponding to the color green, and pixels corresponding to the color blue. However, the EL layer 5086 is weak with respect to a solution, and therefore each of the colors must be formed separately without using a photolithography technique. It is preferable to cover areas outside the desired pixels using a metal mask, and selectively form the EL layer and the cathode only in the necessary locations.

Namely, a mask is first set so as to cover all pixels other than ones corresponding to the color red, and a red color light emitting EL layer and a cathode are selectively formed using the mask. Next, a mask is set so as to cover all pixels other than ones corresponding to the color green, and a green color light emitting EL layer and a cathode are selectively formed. A mask is similarly set so as to cover all pixels other than ones corresponding to the color blue, and a blue color light emitting EL layer and a cathode are selectively formed. Note that although it is stated here that all differing masks are used, the same mask may also be reused. Further, it is preferable to perform processing up through the formation of the EL layers and the cathodes in all pixels without breaking the vacuum.

A method of forming three types of EL elements corresponding to each color RGB is used here, but methods such as a method of combining color filters and white color light emitting EL elements; a method of combining blue color or blue-green color light emitting EL elements and a fluorescing body (fluorescing color conversion layer, CCM), and a method of utilizing transparent electrodes in the cathodes (opposing electrodes) and overlapping EL elements corresponding to RGB may also be used.

Note that known materials may be used for the EL layer 5086. Organic materials may be preferably used as the known materials, taking a driver voltage into consideration. For example, a four layer structure of a hole injecting layer, a hole transporting layer, a light emitting layer, and an electron injecting layer may be used. Further, an example of using an MgAg electrode as the cathode of the EL element is shown in Embodiment 2, but it is also possible to use other known materials.

A protecting electrode 5088 is formed next, covering the EL layers and the cathodes. A conductive film having aluminum as its main constituent may be used as the protecting electrode 5088. The protecting electrode 5088 may be formed by vacuum evaporation using a different mask from that used in forming the EL layers and the cathodes. Further, it is preferable to form the protecting electrode after forming the EL layers and the cathodes, without exposure to the atmosphere.

Finally, a passivation film 5089 is formed of a silicon nitride film with a thickness of 300 nm. In practice, the protecting electrode 5088 fulfills a role of protecting the EL layers 5086 from contaminants such as moisture, and in addition, the reliability of the EL elements can be additionally increased by forming the passivation film 5089.

An active matrix electronic device having a structure like that shown in FIG. 13B is thus completed. Note that, in the manufacturing processes for the active matrix electronic device in Embodiment 2, the source signal lines are formed by Ta and W, materials used to form the gate electrodes, due to the circuit structure and processing considerations. In addition, the gate signal lines are formed by Al, the wiring material used in forming the source and drain electrodes. However, different materials may also be used.

In the active matrix substrate of Embodiment 2 an extremely high reliability is thus shown, and the operating characteristics are also improved not only in the pixel portion, but also in the driver circuit portion by arranging TFTs having suitable structures. It is also possible to add a metallic catalyst such as Ni in the crystallization step, thereby increasing crystallinity. It therefore becomes possible to set the driving frequency of the source signal line driver circuit to 10 MHz or higher.

First, a TFT having a structure in which hot carrier injection is reduced without even a small drop in the operating speed is used as an n-channel TFT of a CMOS circuit forming the driver circuit portion. Note that the driver circuit referred to here includes circuits such as a shift register, a buffer, a level shifter, a latch in line-sequential drive, and a transmission gate in dot-sequential drive.

In Embodiment 2, the active layer of the n-channel TFT contains a source region, a drain region, a GOLD region, an LDD region, and a channel forming region, and the GOLD region overlaps with the gate electrode through the gate insulating film.

Further, there is not much need to worry about degradation due to hot carrier injection with the p-channel TFT of the CMOS circuit, and therefore LDD regions need not be formed in particular. It is of course possible to form an LDD region similar to that of the n-channel TFT, as a measure against hot carriers.

In addition, when using a CMOS circuit in which electric current flows in both directions in the channel forming region, namely a CMOS circuit in which the roles of the source region and the drain region interchange, it is preferable that LDD regions be formed on both sides of the channel forming region of the n-channel TFT forming the CMOS circuit, sandwiching the channel forming region. A circuit such as a transmission gate used in dot-sequential drive can be given as such an example. Further, when a CMOS circuit in which it is necessary to suppress the value of the off current as much as possible is used, the n-channel TFT forming the CMOS circuit preferably has a structure in which a portion of the LDD region overlaps with the gate electrode through the gate insulating film. A circuit such as the transmission gate used in dot-sequential drive can be given as such an example.

Note that, in practice, it is preferable to perform packaging (sealing), without exposure to the atmosphere, using a protective film (such as a laminated film or an ultraviolet hardened resin film) having good airtight characteristics and little outgassing, and a transparent sealing material, after completing through the state of FIG. 13B. At this time, the reliability of the EL element is increased by making an inert atmosphere on the inside of the sealing material and by arranging a drying agent (barium oxide, for example) inside the sealing material.

Furthermore, after the airtight properties have been increased in accordance with the packaging process, a connector (flexible printed circuit, FPC) is attached in order to connect terminals drawn from the elements and circuits formed on the substrate with external signal terminals. And a finished product is completed. The device in this state at which it is ready for delivery as the product is referred to as an electronic device throughout this specification.

Embodiment 3

An example of manufacturing an electronic device using the present invention is explained in Embodiment 3.

Figure 14A:
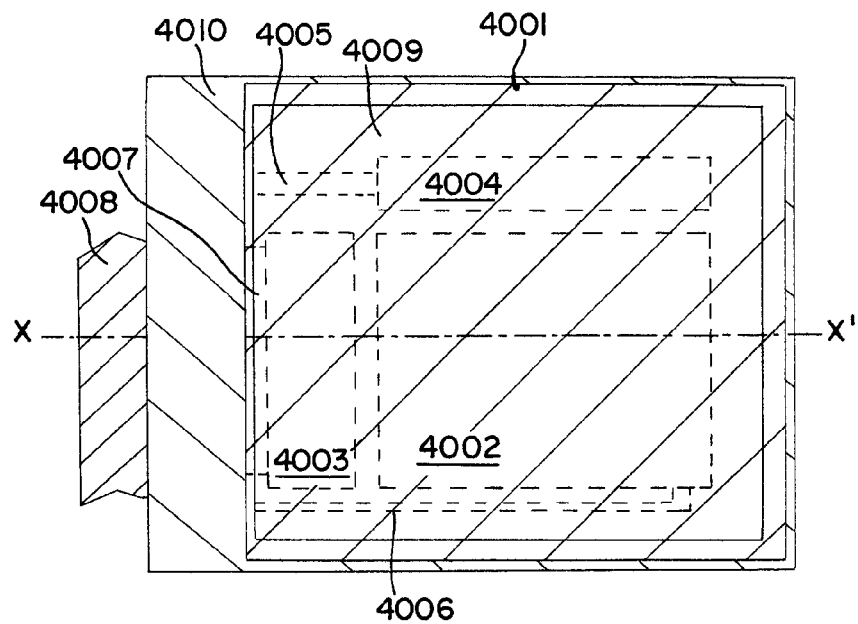
FIGS. 14A and 14B are a top surface diagram and a cross sectional diagram, respectively, of an electronic device shown in Embodiment 3.
Figure 14B:
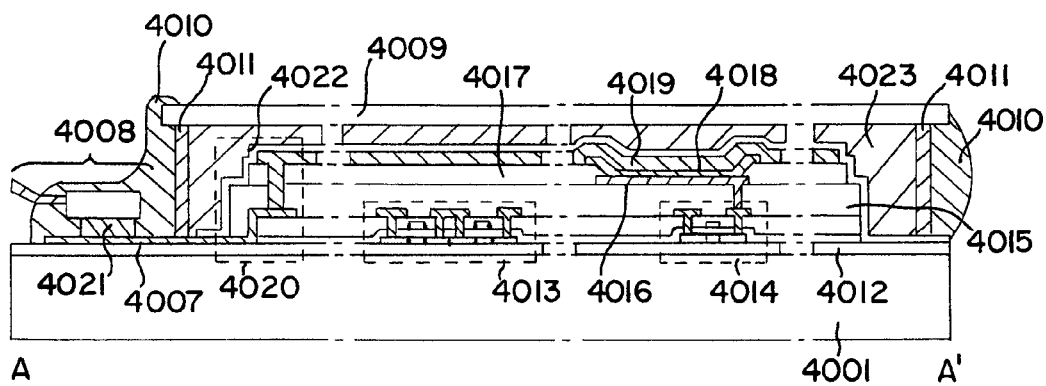

FIG. 14A is a top view of an electronic device using the present invention and FIG. 14B shows a cross sectional diagram in which FIG. 14A is cut along the line X–X'. In FIG. 14A, reference numeral 4001 is a substrate, reference numeral 4002 is a pixel portion, reference numeral 4003 is a source signal line side driver circuit, and reference numeral 4004 is a gate signal line side driver circuit. The respective driver circuits are connected to external equipments, through an FPC 4008, via wirings 4005, 4006 and 4007.

A covering material 4009, an airtight sealing material 4010 and a sealing material (also referred to as a housing material) 4011 (shown in FIG. 14B) are formed so as to enclose the pixel portion, preferably the driver circuits and the pixel portion, at this point.

Further, FIG. 14B is a cross sectional structure of the electronic device of Embodiment 3. A driver circuit TFT 4013 (note that a CMOS circuit in which an n-channel TFT and a p-channel TFT are combined is shown in the figure here) and a pixel portion TFT 4014 (note that only an EL driver TFT for controlling the current flowing to an EL element is shown here) are formed on a base film 4012 which is formed on a substrate 4001. The TFTs may be formed using a known structure (a top gate structure or a bottom gate structure).

After the driver circuit TFT 4013 and the pixel portion TFT 4014 are completed using a known manufacturing method, a pixel electrode 4016 is formed on an interlayer insulating film (leveling film) 4015 made from a resin material. The pixel electrode is formed from a transparent conducting film for electrically connecting to a drain of the pixel TFT 4014. A compound of indium oxide and tin oxide (referred to as ITO) or a compound of indium oxide and zinc oxide can be used as the transparent conducting film. An insulating film 4017 is formed after forming the pixel electrode 4016, and an open portion is formed on the pixel electrode 4016.

An EL layer 4018 is formed next. A known technique may be used to determine which structure to use. Further, EL materials include low molecular weight materials and high molecular weight (polymer) materials. Evaporation is used when using a low molecular weight material, but it is possible to use easy methods such as spin coating, printing, and ink jet printing when a high molecular weight material is employed.

In Embodiment 3, the EL layer is formed by evaporation using a shadow mask. Color display becomes possible by forming emitting layers (a red color emitting layer, a green color emitting layer, and a blue color emitting layer), capable of emitting light having different wavelengths, for each pixel using a shadow mask. In addition, methods such as a method of combining a color conversion layer (CCM) and color filters, and a method of combining a white color light emitting layer and color filters may also be used. Of course, the electronic device can also be made to emit a single color of light.

After forming the EL layer 4018, a cathode 4019 is formed on the EL layer. It is preferable to remove as much as possible any moisture or oxygen existing in the interface between the cathode 4019 and the EL layer 4018. It is therefore necessary to use a method of continuously depositing the EL layer 4018 and the cathode 4019 within a vacuum or depositing the EL layer 4018 in an inert gas atmosphere and depositing the cathode 4019 without exposing to an atmosphere. The above film deposition becomes possible in Embodiment 3 by using a multi-chamber method (cluster tool method) film deposition apparatus.

Note that a lamination structure of a LiF (lithium fluoride) film and an Al (aluminum) film is used in Embodiment 3 as the cathode 4019. Specifically, a 1 nm thick LiF (lithium fluoride) film is formed by evaporation on the EL layer 4018, and a 300 nm thick aluminum film is formed on the LiF film. An MgAg electrode, a known cathode material, may of course also be used. The wiring 4007 is then connected to the cathode 4019 in a region denoted by reference numeral 4020. The wiring 4007 is a power supply line for imparting a predetermined voltage to the cathode 4019, and is connected to the FPC 4008 through a conductive paste material 4021.

In order to electrically connect the cathode 4019 and the wiring 4007 in the region denoted by reference numeral 4020, it is necessary to form a contact hole in the interlayer insulating film 4015 and the insulating film 4017. The contact holes may be formed at the time of etching the interlayer insulating film 4015 (when forming a contact hole for the pixel electrode) and at the time of etching the insulating film 4017 (when forming the open portion before forming the EL layer). Further, when etching the insulating film 4017, etching may be performed all the way to the interlayer insulating film 4015 at one time. A good contact hole can be formed in this case, provided that the interlayer insulating film 4015 and the insulating film 4017 are the same resin material.

A passivation film 4022, a filling material 4023, and the covering material 4009 are formed covering the surface of the EL element thus formed.

In addition, the sealing material 4011 is formed between the covering material 4009 and the substrate 4001, so as to enclose the EL element portion, and the airtight sealing material (the second sealing material) 4010 is formed on the outside of the sealing material 4011.

The filling material 4023 functions as an adhesive for bonding the covering material 4009 at this point. PVC (polyvinyl chloride), epoxy resin, silicone resin, PVB (polyvinyl butyral), and EVA (ethylene vinyl acetate) can be used as the filling material 4023. If a drying agent is formed on the inside of the filling material 4023, then it can continue to maintain a moisture absorbing effect, which is preferable. It is also preferable that antioxidant or the like which can capture oxygen, is provided in the inside of this filling material 4023, since deterioration of the EL layer can be prevented.

Further, spacers may be contained within the filling material 4023. The spacers may be a powdered substance such as BaO, giving the spacers themselves the ability to absorb moisture.

When using spacers, the passivation film 4022 can relieve the spacer pressure. Further, a film such as a resin film can be formed separately from the passivation film to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 4009. Note that if PVB or EVA is used as the filling material 4023, it is preferable to use a sheet with a structure in which several tens of $\mu$m of aluminum foil is sandwiched by a PVF film or a Mylar film.

However, depending upon the light emission direction from the EL element (the light radiation direction), it is necessary for the covering material 4009 to have light transmitting characteristics.

Further, the wiring 4007 is electrically connected to the FPC 4008 through a gap between the sealing material 4011, airtight sealing material 4010 and the substrate 4010. Note that although an explanation of the wiring 4007 has been made here, other wirings 4005 and 4006 are also electrically connected to the FPC 4008 by similarly passing underneath the sealing material 4011 and the airtight sealing material 4010.

In Embodiment 3, the covering material 4009 is bonded after forming the filling material 4023, and the sealing material 4011 is attached so as to cover the lateral surfaces (exposed surfaces) of the filling material 4023, but the filling material 4023 may also be formed after attaching the covering material 4009 and the sealing material 4011. In this case, a filling material injection opening is formed through a gap formed by the substrate 4001, the covering material 4009, and the sealing material 4011. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

Embodiment 4

In Embodiment 4, an example of manufacturing an electronic device having a different structure from that of Embodiment 3 by using the present invention is explained with reference to FIGS. 15A and 15B. Parts having the same reference numerals as those of FIGS. 14A and 14B indicate the same portions, and therefore an explanation of those parts is omitted.

Figure 15A:
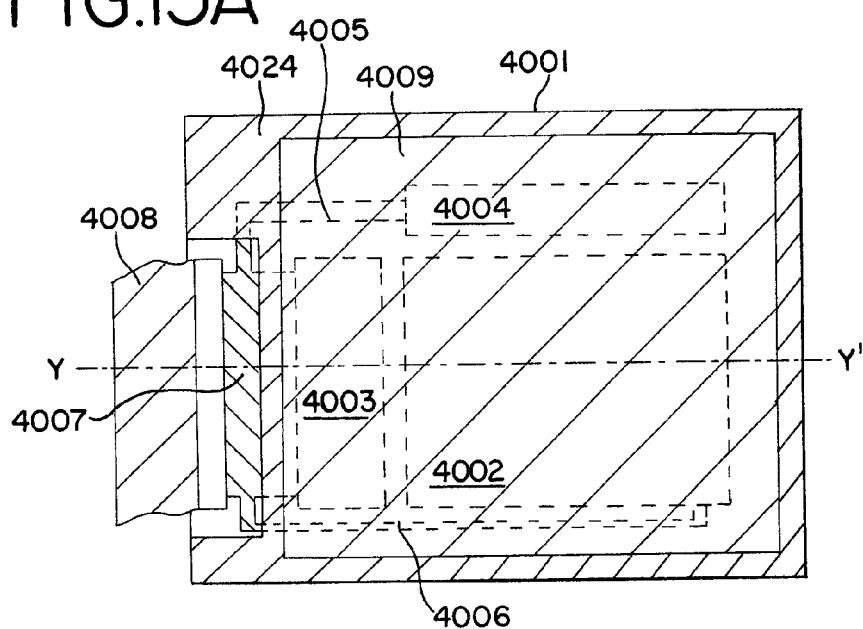
FIGS. 15A and 15B are a top surface diagram and a cross sectional diagram, respectively, of an electronic device shown in Embodiment 4.
Figure 15B:
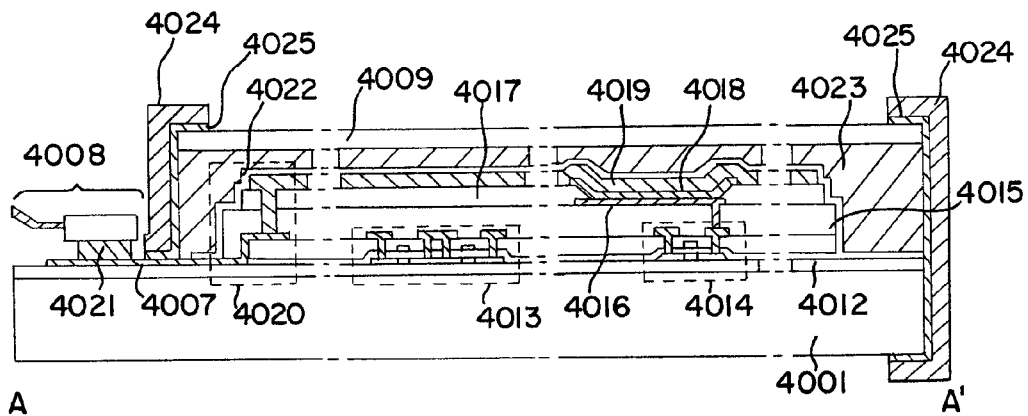

FIG. 15A is a top view of an electronic device of Embodiment 4, and FIG. 15B shows a cross sectional diagram in which FIG. 15A is cut along the line Y–Y'.

In accordance with Embodiment 3, manufacturing is performed through the step of forming the passivation film 4022 covering the surface of the EL element.

In addition, the filling material 4023 is formed so as to cover the EL element. The filling material 4023 also functions as an adhesive for bonding the covering material 4009. PVC (polyvinyl chloride), epoxy resin, silicone resin, PVB (polyvinyl butyral), and EVA (ethylene vinyl acetate) can be used as the filling material 4023. If a drying agent is provided on the inside of the filling material 4023, then it can continue to maintain a moisture absorbing effect, which is preferable. It is also preferable that antioxidant or the like which can capture oxygen, is provided in the inside of this filling material 4023, since deterioration of the EL layer can be prevented.

Further, spacers may be contained within the filling material 4023. The spacers may be a powdered substance such as BaO, giving the spacers themselves the ability to absorb moisture.

When using spacers, the passivation film 4022 can relieve the spacer pressure. Further, a film such as a resin film can be formed separately from the passivation film to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 4009. Note that if PVB or EVA is used as the filling material 4023, it is preferable to use a sheet with a structure in which several tens of $\mu$m of aluminum foil is sandwiched by a PVF film or a Mylar film.

However, depending upon the light emission direction from the EL element (the light radiation direction), it is necessary for the covering material 4009 to have light transmitting characteristics.

After bonding the covering material 4009 using the filling material 4023, the frame material 4024 is attached so as to cover the lateral surfaces (exposed surfaces) of the filling material 4023. The frame material 4024 is bonded by the sealing material (which functions as an adhesive) 4025. It is preferable to use a light hardening resin as the sealing material 4025 at this point, but provided that the heat resistance characteristics of the EL layer permit, a thermal hardening resin may also be used. Note that it is preferable that the sealing material 4025 be a material which, as much as possible, does not transmit moisture and oxygen. Further, a drying agent may also be added to an inside portion of the sealing material 4025.

The wiring 4007 is electrically connected to the FPC 4008 through a gap between the sealing material 4025 and the substrate 4001. Note that although an explanation of the wiring 4007 has been made here, other wirings 4005 and 4006 are also electrically connected to the FPC 4008 by similarly passing underneath the sealing material 4025.

Note that the covering material 4009 is bonded after forming the filing material 4023 is formed, and the frame material 4024 is attached so as to cover the lateral surfaces (exposed surfaces) of the filling material 4023 in accordance with Embodiment 4, but the filling material 4023 may also be formed after attaching the covering material 4009, the sealing material 4025 and the frame material 4024. In this case, a filling material injection opening is formed through a gap formed by the substrate 4001, the covering material 4009, sealing material 4025 and the frame material 4024. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

Embodiment 5

Figure 16:
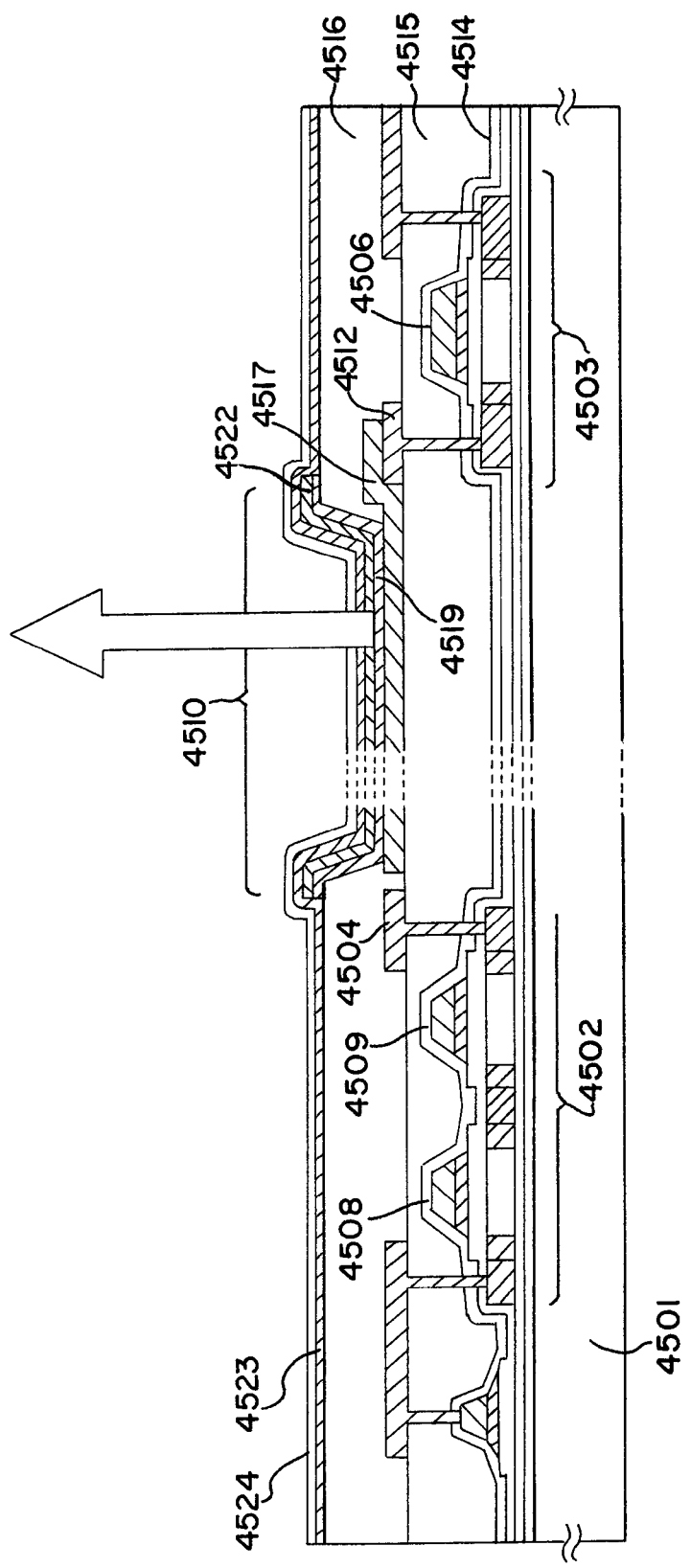
FIG. 16 is a cross sectional diagram of a pixel portion of an electronic device shown in Embodiment 5.

Here, FIG. 16 shows a more detailed sectional structure of a pixel portion of an electronic device in accordance with the present invention.

In FIG. 16, a switching TFT 4502 provided on a substrate 4501 is formed by using an n-channel TFT in accordance with Embodiment 5. In this embodiment, although a double gate structure is used, since there is no big difference in the structure and fabricating process, explanation is omitted. However, a structure in which two TFTs are substantially connected in series with each other is obtained by adopting the double gate structure, and there is a merit that an off current value can be decreased. Note that although the double gate structure is adopted in this embodiment, a single gate structure may be adopted, or a triple gate structure or a multi-gate structure having more gates may be adopted. Further, it may be formed by using a p-channel TFT.

Further, an EL driving TFT 4503 is formed by using an n-channel TFT. A drain wiring 4504 of the switching TFT 4502 is electrically connected to a gate electrode 4506 of the EL driving TFT 4503 through a wiring (not shown in figure).

In a case where a driving voltage of the electronic device is high (10V or more), a driver circuit TFT, in particular an N-channel type TFT, has high fear of deterioration due to hot carriers or the like. Thus, it is very effective to adopt a structure in which an LDD region (GOLD region) is provided at a drain side of the N-channel type TFT, or at source and drain sides so as to overlap with a gate electrode through a gate insulating film, as shown in FIG. 13B of Embodiment 2. In a case where a driving voltage is low (10V or less), there is no fear of deterioration due to hot carrier. Thus, as shown in FIG. 16 of Embodiment 5, there is no need to provide a GOLD region. However, with respect to the switching TFT 4502 in a pixel portion, it is very effective to adopt a structure in which an LDD region is provided at a drain side of the N-channel type TFT, or at source and drain sides so as not to overlap with a gate electrode through a gate insulating film to reduce an off-current. At this time, with respect to the EL driving TFT 4503, there is no need to provide an LDD region, however, a private (dedicated) mask is necessary to cover the portion of the EL driving TFT 4503 with a resist when an LDD region is formed in the switching TFT 4502. Therefore, in Embodiment 5, the EL driving TFT 4503 is formed with the same structure as that of the switching TFT 4502 to reduce the mask number.

The manufacturing processes of TFTs having a structure shown in Embodiment 5 will be described herein with reference to FIG. 17.

Figure 11B:
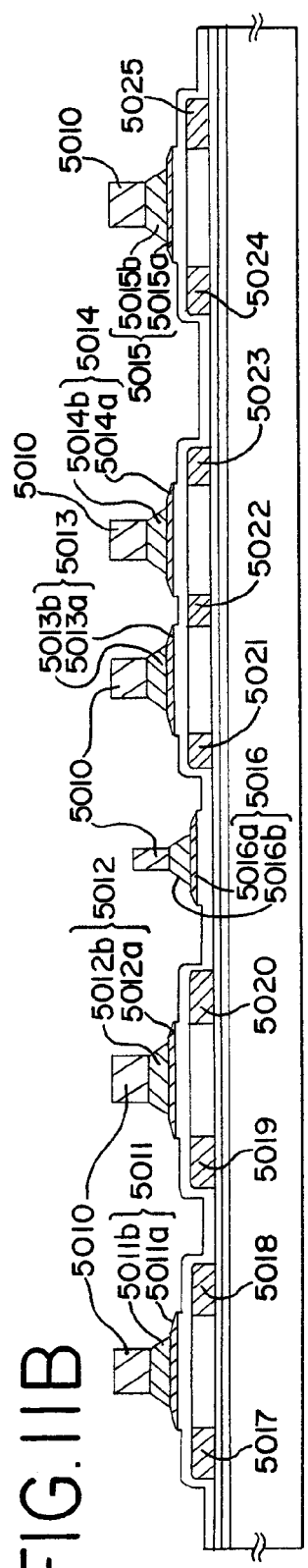
Figure 11C:
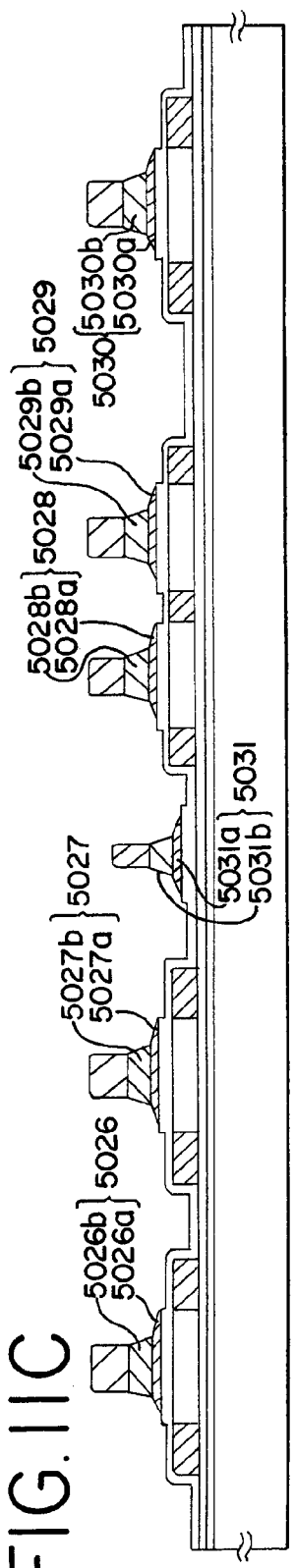
Figure 17A:
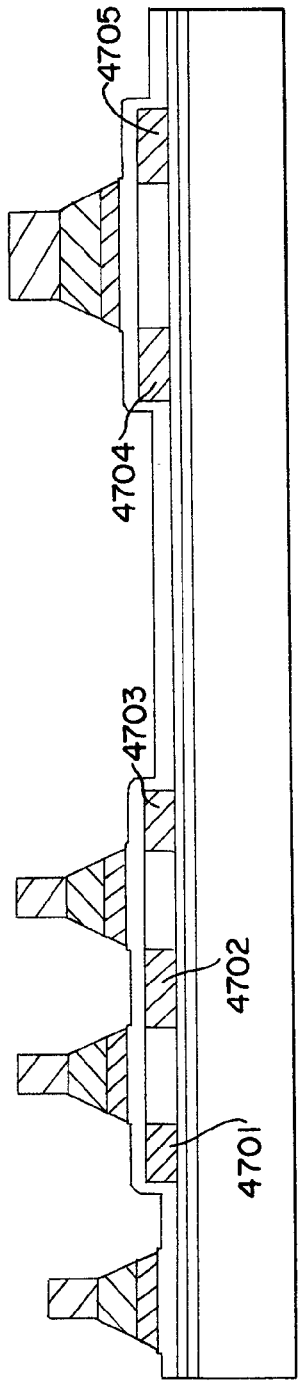
FIGS. 17A and 17B are diagrams showing examples of generation acknowledgment of the electronic device shown in Embodiment 5.
Figure 17B:
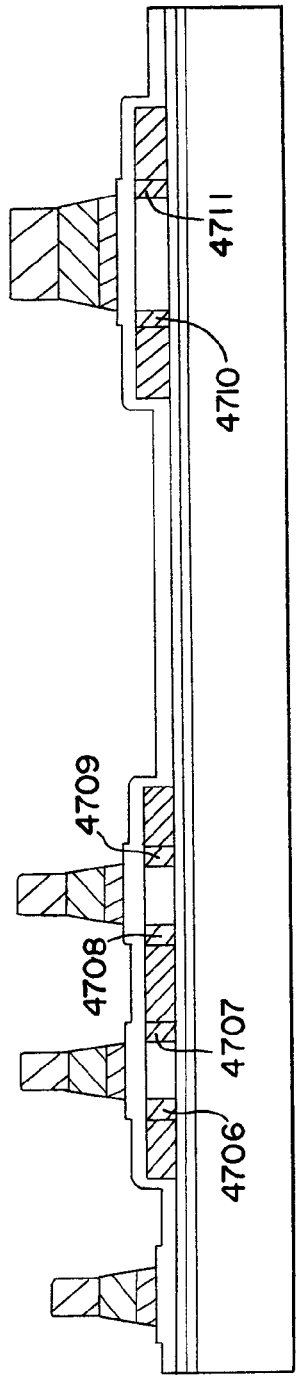

FIG. 17A shows a state which is obtained after the processes illustrated in FIG. 11B are completed in accordance with Embodiment 2. By employing up to the processes, first impurity regions 4701 to 4705 are formed. Subsequently, a first conductive film made of a Ta film and a second conductive film made of a W film are etched as shown in FIG. 17B, and second impurity regions 4706 to 4711 having lower concentration than that of the first impurity regions are formed inside the first impurity regions formed in an island-like semiconductor layer in FIG. 17A. Thus formed second impurity regions 4706 to 4711 will be the above mentioned LDD region.

In accordance with Embodiment 2, again, a TFT substrate may be completed by employing processes shown after FIG. 12B.

In this embodiment, although the EL driving TFT 4503 is shown as a single gate structure, a multi-gate structure in which a plurality of TFTs are connected in series with each other may be adopted. Further, such a structure may be adopted that a plurality of TFTs are connected in parallel with each other to substantially divide a channel forming region into plural portions, so that radiation of heat can be made at high efficiency. Such structure is effective as a countermeasure against deterioration due to heat.

Further, the wiring (not shown in figure) including the gate electrode 4506 of the EL driving TFT 4503 partly overlaps with a drain wiring 4512 of the EL driving TFT 4503 through an insulating film, and a storage capacitor is formed in the region. The storage capacitor functions to store a voltage applied to the gate electrode 4506 of the EL driving TFT 4503.

A first interlayer insulating film 4514 is provided on the switching TFT 4502 and the EL driving TFT 4503, and a second interlayer insulating film 4515 made of a resin insulating film is formed thereon.

Reference numeral 4517 designates a pixel electrode (cathode of the EL element) made of a conductive film having high reflectivity. The pixel electrode is formed to overlap partly with a drain region of the EL driving TFT 4503 and electrically connected to the drain region. As the pixel electrode 4517, it is preferable to use a low resistance conductive film, such as an aluminum alloy film, a copper alloy film or a silver alloy film, or a lamination film of those. Of course, a laminate structure with another conductive film may be adopted.

Then, an organic resin film 4516 is formed on the pixel electrode 4517 and the portion which faces to the pixel electrode 4517 is patterned to form an EL layer 4519. Herein, although not shown in figure, light-emitting layers corresponding to each color of R (red), G (green), and B (blue) may be formed. As an organic EL material used for the light-emitting layer, a π-conjugate polymer material is used. Typical examples of the polymer material include polyparaphenylene vinylene (PPV), polyvinyl carbazole (PVK), and polyfluorene.

Although various types exist as the PPV typed organic EL material, for example, a material as disclosed in "H. Shenk, H. Becker, O Gelsen, E. Kluge, W. Kreuder, and H. Spreitzer, "Polymers for Light Emitting Diodes", Euro Display, Proceedings, 1999, p. 33–37" or Japanese Patent Application Laid-open No. Hei. 10-92576 may be used.

As a specific light emitting layer, it is appropriate that cyanopolyphenylene-vinylene is used for a light emitting layer emitting red light, polyphenylenevinylene is used for a light emitting layer emitting green light, and polyphenylenevinylene or polyalkylphenylene is used for a light emitting layer emitting blue light. It is appropriate that the film thickness is made 30 to 150 nm (preferably 40 to 100 nm).

However, the above examples are an example of the organic EL material which can be used for the light emitting layer, and it is not necessary to limit the invention to these. The EL layer (layer in which light emission and movement of carriers for that are performed) may be formed by freely combining a light emitting layer, a charge transporting layer and a charge injecting layer.

For example, although this embodiment shows the example in which the polymer material is used for the light emitting layer, a low molecular organic EL material may be used. It is also possible to use an inorganic material such as silicon carbide, as the charge transporting layer or the charge injecting layer. As the organic EL material or inorganic material, a well-known material can be used.

At the point when the anode 4523 was formed, an EL element 4510 is completed. Incidentally, the EL element 4510 here indicates a storage capacitor formed of the pixel electrode (cathode) 4517, the light emitting layer 4519, the hole injecting layer 4522 and the anode 4523.

In this embodiment, a passivation film 4524 is further provided on the anode 4523. As the passivation film 4524, a silicon nitride film or a silicon nitride oxide film is desirable. This object is to insulate the EL element from the outside, and has both meaning of preventing deterioration due to oxidation of the organic EL material and suppressing degassing from the organic EL material. By doing this, reliability of the electronic device is improved.

As described above, the electronic device described in the Embodiment 5 includes the pixel portion comprising the pixel having the structure as shown in FIG. 16, and includes the switching TFT having a sufficiently low off current value and the EL driving TFT resistant to hot carrier injection. Thus, it is possible to obtain the electronic device which has high reliability and can make excellent image display.

In the case of an EL element having the structure described in Embodiment 5, light generated in the light emitting layer 4519 is radiated to the substrate on which TFTs are formed as indicated by an arrow.

Embodiment 6

Figure 18:
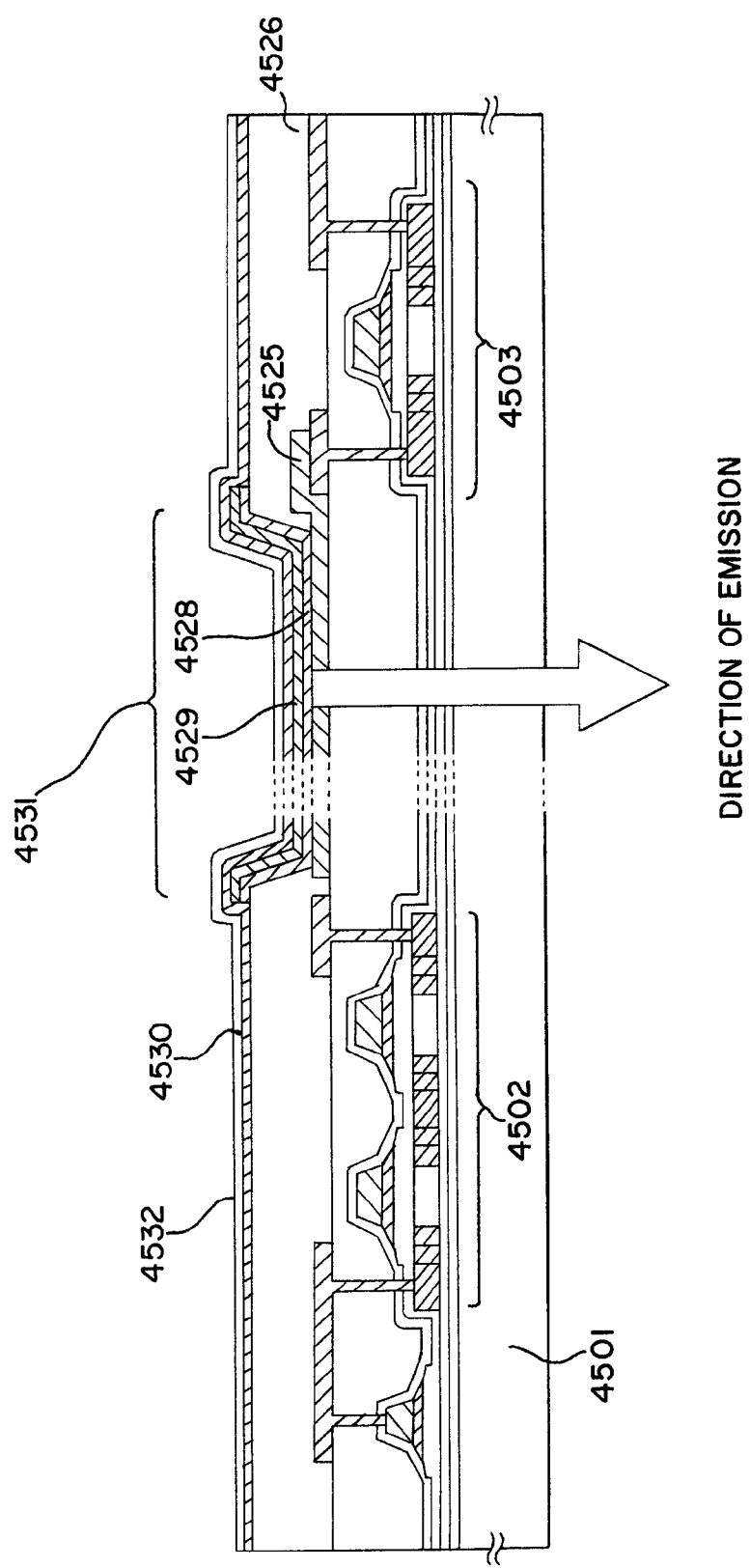
FIG. 18 is a cross sectional diagram of a pixel portion of an electronic device shown in Embodiment 6.
Figure 19A:
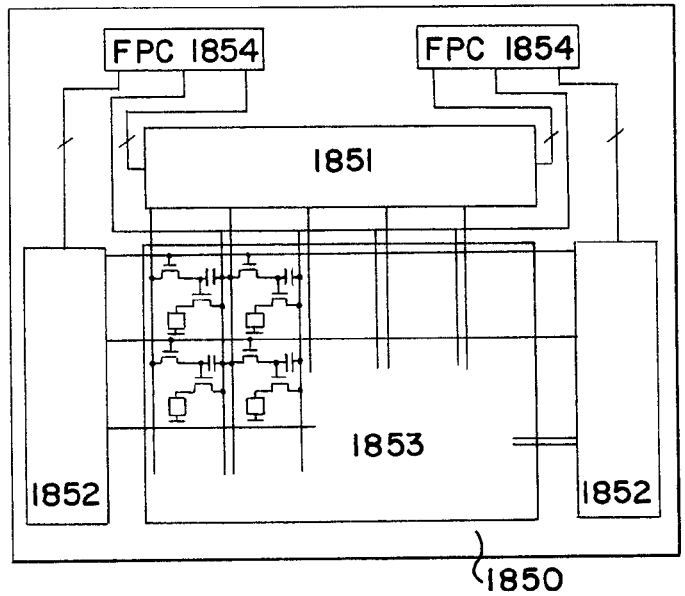
FIGS. 19A and 19B are circuit diagrams of conventional electronic devices.
Figure 19B:
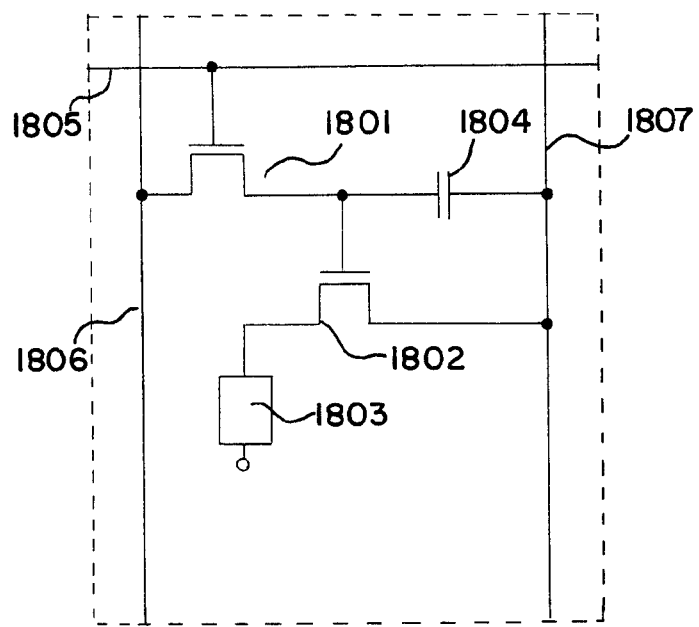

In this embodiment, the structure of the EL element 4510 which is reversed in a pixel portion shown in FIG. 16 of Embodiment 5 will be described. FIG. 18 will be referred for the explanation. Note that the different point of the structure illustrated in FIG. 16 is only an EL element portion and a TFT portion, so that the rest will not be explained.

In FIG. 16, as the switching TFT 4502, a p-channel TFT formed in accordance with a known method will be used. As the EL driving TFT 4503, a p-channel TFT formed in accordance with a known method is used. It is desirable to use the switching TFT and the EL driving TFT having the same polarity.

In Embodiment 6, a transparent conductive film is used as the pixel electrode (anode) 4525. Specifically, a conductive film made of a compound of indium oxide and zinc oxide is used. Of course, a conductive film made of a compound of indium oxide and tin oxide.

Then, a third interlayer insulating film 4526 made of a resin film is formed, a light-emitting layer 4528 is formed. On the light-emitting layer 4528, an electron injection layer 4529 made of potassium acetyl acetonate (acacK), and a cathode 4530 made of an aluminum alloy are formed.

Subsequently, in the same way as in Embodiment 5, a passivation film 4532 is formed to prevent oxidation of an organic EL material, thereby forming an EL element 4531.

In the case of an EL element having the structure described in Embodiment 6, light generated in the light emitting layer 4528 is radiated to the substrate on which TFTs are formed as indicated by an arrow.

Embodiment 7

In Embodiment 7, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical Processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical Formula 1)

(M. A. Baldo, D.F.O' Brien, Y. You, A. Shoustikov, S. Sibley, M. E. Thompson, S. R. Forrest, Nature 395 (1998) p.151)

The molecular formula of an EL material (Pt complex) reported by the above article is represented as follows.

(Chemical Formula 2)

(M. A. Baldo, S. Lamansky, P. E. Burrows, M. E. Thompson, S. R. Forrest, Appl. Phys. Lett., 75 (1999) p.4.)

(T. Tsutsui, M. -J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.

(Chemical Formula 3)

As described above, if phosphorescence from a triplet exciton can be put to practical use, it can realize the external light emitting quantum efficiency three to four times as high as that in the case of using fluorescence from a singlet exciton in principle. The structure according to this embodiment can be freely implemented in combination of any structures of the Embodiments 1 to 6.

Embodiment 8

An EL display device using electronic devices of the present invention has superior visibility in bright locations in comparison to a liquid crystal display device because it is a self-emissive type device, and moreover its field of vision is wide. Accordingly, it can be used as a display portion for various electronic devices. For example, it is appropriate to use the EL display device of the present invention as a display portion of an EL display having a diagonal equal to 30 inches or greater (typically equal to 40 inches or greater) for appreciation of TV broadcasts by large screen.

Note that all displays exhibiting (displaying) information such as a personal computer display, a TV broadcast reception display, or an advertisement display are included as the EL display. Further, the EL display device of the present invention can be used as a display portion of the other various electronic devices.

The following can be given as examples of such electronic devices: a video camera; a digital camera; a goggle type display (head mounted display); a car navigation system; an audio reproducing device (such as a car audio system, an audio compo system); a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the field of vision is regarded as very important. Thus, it is preferable that the EL display device is employed. Examples of these electronic devices are shown in FIGS. 22 to 23.

Figure 22A:
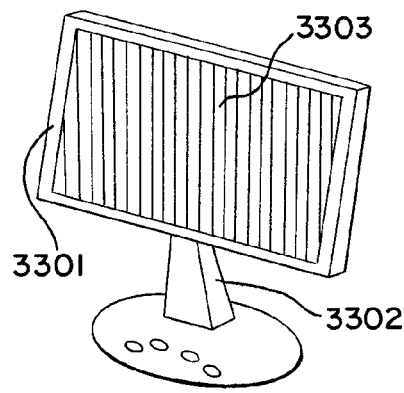
FIGS. 22A to 22F are diagrams showing examples of electronic equipment incorporating an electronic device of the present invention.

FIG. 22A is an EL display, containing a casing 3301, a support stand 3302, and a display portion 3303. The electronic device of the present invention can be used in the display portion 3303. Since the EL display is a self-emissive type device with no need of a backlight, its display portion can be made thinner than a liquid crystal display device.

Figure 22B:
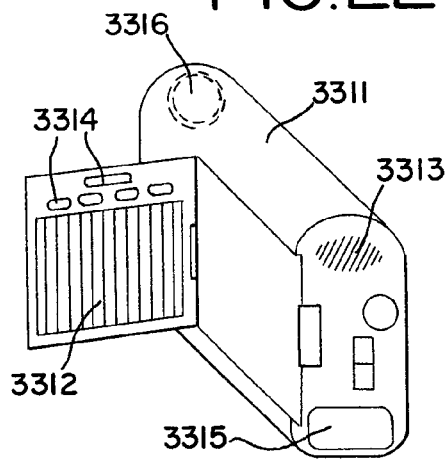

FIG. 22B is a video camera, containing a main body 3311, a display portion 3312, an audio input portion 3313, operation switches 3314, a battery 3315, and an image receiving portion 3316. The electronic device of the present invention can be used in the display portion 3312.

Figure 22C:
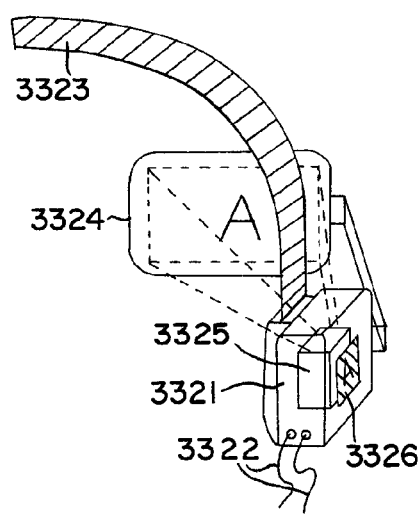

FIG. 22C is a portion of a head mounted type EL display (right side), containing a main body 3321, a signal cable 3322, a head fixing band 3323, a display portion 3324, an optical system 3325, and a display device 3326. The electronic device of the present invention can be used in the display device 3326.

Figure 22D:
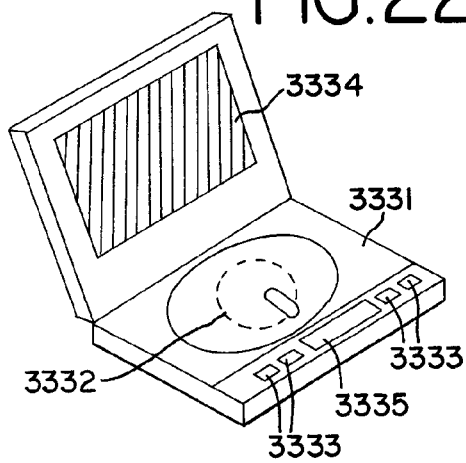

FIG. 22D is an image playback device (specifically, a DVD playback device) provided with a recording medium, containing a main body 3331, a recording medium (such as a DVD) 3332, operation switches 3333, a display portion (a) 3334, and a display portion (b) 3335. The display portion (a) 3334 is mainly used for displaying image information, and the display portion (b) 3335 is mainly used for displaying character information, and the electronic device of the present invention can be used in the display portion (a) 3334 and in the display portion (b) 3335. Note that domestic game equipment is included as the image playback device provided with a recording medium.

Figure 22E:
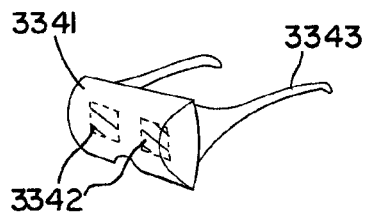

FIG. 22E is a goggle type display device (head mounted display), containing a main body 3341, a display portion 3342, and arm portion 3343. The electronic device of the present invention can be used in the display portion 3342.

Figure 22F:
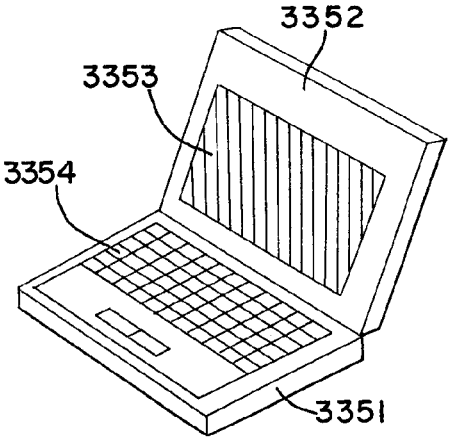

FIG. 22F is a personal computer, containing a main body 3351, a casing 3352, a display portion 3353, and a keyboard 3354. The electronic device of the present invention can be used in the display portion 3353.

Note that if the emission luminance of EL materials becomes higher in the future, it will be possible to use the EL display device of the present invention in a front type or a rear type projector by projecting light including outputted images, which can be enlarged by lenses or the like.

The above electronic devices are becoming more often used to display information provided through an electronic transmission circuit such as the Internet or CATV (cable television), and in particular, opportunities for displaying animation information are increasing. The response speed of EL materials is extremely high, and therefore the EL display device is favorable for performing animation display.

The emitting portion of the EL display device consumes power, and therefore it is preferable to display information so as to have the emitting portion become as small as possible. Therefore, when using the EL display device in a display portion which mainly displays character information, such as a portable information terminal, in particular, a portable telephone and an audio reproducing device, it is preferable to drive it by setting non-emitting portions as background and forming character information in emitting portions.

Figure 23A:
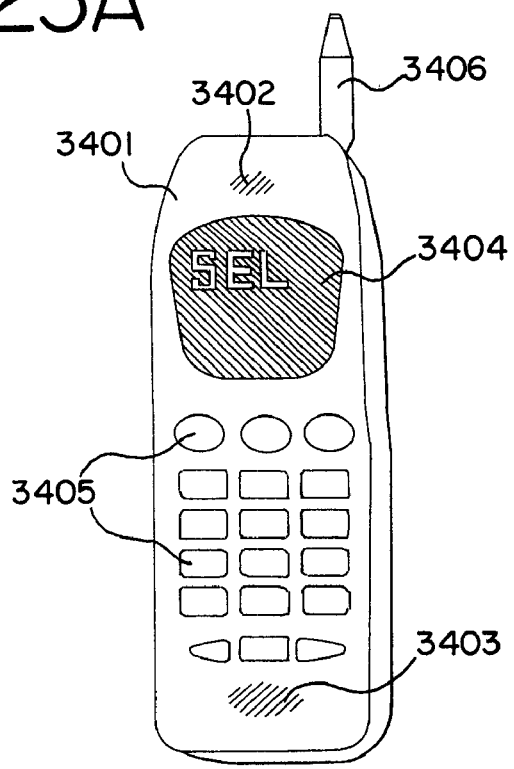
FIGS. 23A and 23B are diagrams showing examples of electronic equipment incorporating an electronic device of the present invention.

FIG. 23A is a portable telephone, containing a main body 3401, an audio output portion 3402, an audio input portion 3403, a display portion 3404, operation switches 3405, and an antenna 3406. The electronic device of the present invention can be used in the display portion 3404. Note that by displaying white characters in a black background in the display portion 3404, the power consumption of the portable telephone can be reduced.

Figure 23B:
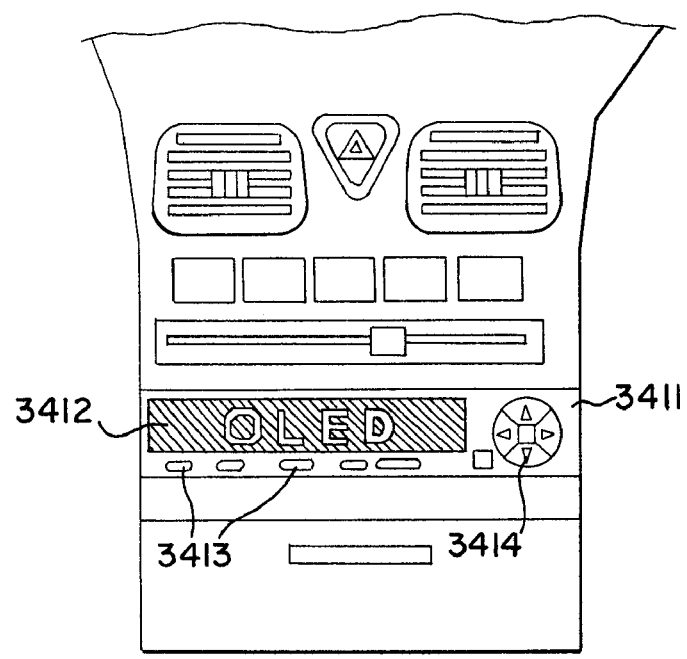

FIG. 23B is an audio reproducing device, specifically a car audio system, containing a main body 3411, a display portion 3412, and operation switches 3413 and 3414. The electronic device of the present invention can be used in the display portion 3412. Furthermore, an audio reproducing device for a car is shown in Embodiment 8, but it may also be used for a portable type and a domestic type of audio reproducing device. Note that by displaying white characters in a black background in the display portion 3414, the power consumption can be reduced. This is particularly effective in a portable type audio reproducing device.

The range of applications of the present invention is thus extremely wide, and it is possible to apply the present invention to electronic devices in all fields. Furthermore, any constitution of the electronic device shown in Embodiments 1 to 7 may be employed in the electronic equipment of Embodiment 8.

Source signal lines and gate signal lines can be utilized in supplying electric current flowing in EL elements and therefore effective wiring resistance of overall electric current supply lines can be decreased by using an electronic device having a pixel structured in accordance with the present invention. As a result, brightness reductions and brightness unevenness of the EL elements can be improved.

Further, the number of pathways for electric current to flow in the EL elements increases, and therefore crosstalk can be improved. In addition, the load becomes lighter due to the reduction in the wiring resistance. Therefore, when the electric current supply line voltage can be changed into a pulse shape, drop off of the waveform does not develop easily. Thus, even if the panel size is increased, display irregularities such as a drop in brightness and crosstalk become difficult to develop, and this can contribute greatly to an increase in image quality.

What is claimed is:

1. An electronic device having a source signal line side driver circuit, a gate signal line side driver circuit, and a pixel portion comprising;

a plurality of source signal lines;

a plurality of gate signal lines, each of said plurality of gate signal lines intersecting said plurality of said source signal lines;

a plurality of electric current supply lines;

a plurality of connection control lines a plurality of pixels, each of said plurality of pixels comprising a switching TFT, an EL driver TFT, an EL element and first or second connection transistor;

wherein a gate electrode of said switching TFT is electrically connected to one of said plurality of gate signal lines, one of impurity regions of said switching TFT is electrically connected to one of said plurality of said source signal lines and another one of said impurity regions of said switching TFT is electrically connected to a gate electrode of said EL driver TFT, wherein one of impurity regions of said EL driver TFT is electrically connected to one of said plurality of electric current supply lines and another one of said impurity regions of said EL driver TFT is electrically connected to said EL element, wherein a gate electrode of said first connection transistor is electrically connected to one of said plurality of connection control lines, one of impurity regions of said first connection transistor is electrically connected to one of said source signal lines and another one of said impurity regions of said first connection transistor is electrically connected to one of said plurality of electric current supply lines, wherein a gate electrode of said second connection transistor is electrically connected to one of said plurality of connection control lines, one of impurity regions of said second connecting transistor is electrically connected to one of said plurality of gate signal lines and another one of said impurity regions of second connecting transistor is electrically connected to one of said plurality of electric current supply lines.

2. An electronic device according to claim 1, wherein:

the polarity of an EL driver transistor is p-channel type when one of a source region and a drain region of the EL driver transistor is electrically connected to an anode of the EL element; and the polarity of an EL driver transistor is n-channel type when one of the source region and the drain region of the EL driver transistor is electrically connected to a cathode of the EL element.

3. An electronic device according to claim 1, wherein:
the polarity of a switching transistor is identical to the polarity of the EL driver transistor.

4. An electronic device according to claim 1, wherein:
the gate signal lines are composed of aluminum, or of a material having aluminum as its main constituent.

5. An electronic device according to claim 1 wherein said electronic device is selected from the group consisting of an EL display, a video camera, a head mounted display, a DVD player, a personal computer, a portable telephone, a car audio system.

6. An electric device having at least on electroluminesence display device comprising:
   at least one gate signal line;
   at least one source signal line intersecting said gate signal line;
   at least one EL element;
   at least one electric current supply line;
   a switching TFT, a gate electrode of said switching TFT electrically connected to said gate signal line and one of impurity regions of said switching TFT electrically connected to said source signal line;
   an EL driving TFT, a gate electrode of said EL driving TFT electrically connected to another one of impurity regions of said switching TFT, one of impurity regions of said EL driving TFT electrically connected to said electric current supply line and another one of impurity regions electrically connected to said EL element;
   a connection transistor, a gate electrode of said connection transistor electrically connected to a connection control line, one of impurity regions of said connection transistor electrically connected to said source signal line or said gate signal line another one of impurity regions of said connection transistor electrically connected to said electric current supply line.

7. A method of driving an electronic device, comprising n-bit gray scale control by controlling the length of time during which an EL element is turned on, wherein:
   a first connection transistor or a second connection transistor is conductive during the sustain (turn on) periods which do not overlap with the address (write in) periods; and
   an electric current supply line and a source signal line electrically connected to a source region and a drain region of the first connection transistor are placed in a conducting state, or an electric current supply line and a source signal line electrically connected to a source region and a drain region of the second connection transistor are placed in a conducting state.

8. A method of driving an electronic device, comprising n-bit gray scale control by controlling the length of time during which an EL element is turned on, wherein:
   the supply of electric current to the EL element during the sustain (turn on) periods which do not overlap with the address (write in) periods is performed by an electric current supply line and: a source signal line electrically connected to the electric current supply line through a first connection transistor; or a gate signal line electrically connected to the electric current supply line through a second connection transistor.

9. A method of driving an electronic device, comprising n-bit gray scale control by controlling the length of time during which an EL element is turned on, wherein:
   an electric current supply line and a number i row gate signal line electrically connected to a source region and a drain region of a connection transistor are placed in a conducting state with the number i gate signal line is unselected.

10. An electronic device comprising:
    a plurality of source signal lines, a plurality of gate signal lines, a plurality of electric current supply lines, a connection control line, and a plurality of pixels, each of the plurality of pixels having an EL element and a connection transistor,
    wherein a gate electrode of the connection transistor is electrically connected to the connection control line; and
    one of a source region and a drain region of the connection transistor is electrically connected to any one of the plurality of source signal lines, and the other one of the source region and the drain region is electrically connected to any one of the plurality of electric current control lines.

11. An electronic device according to claim 10, wherein:
    the polarity of an EL driver transistor is p-channel type when one of a source region and a drain region of the EL driver transistor is electrically connected to an anode of the EL element; and
    the polarity of an EL driver transistor is n-channel type when one of the source region and the drain region of the EL driver transistor is electrically connected to a cathode of the EL element.

12. An electronic device according to claim 10, wherein:
    the polarity of a switching transistor is identical to the polarity of an EL driver transistor.

13. An electronic device according to claim 10 wherein:
    the gate signal lines are composed of aluminum, or of a material having aluminum as its main constituent.

14. An electronic device according to claim 10 wherein said electronic device is selected from the group consisting of an EL display, video camera, a head mounted display, a DVD player, a personal computer, a portable telephone, a car audio system.

15. An electronic device comprising:
    a plurality of source signal lines, a plurality of gate signal lines, a plurality of electric current supply lines, a connection control line, and a plurality of pixels, each of the plurality of pixels having an EL element and a connection transistor;
    wherein a gate electrode of the connection transistor is electrically connected to the connection control line; and
    one of a source region and a drain region of the connection transistor is electrically connected to any one of the plurality of gate signal lines, and the other one of the source region and the drain region is electrically connected to any one of the plurality of electric current control lines.

16. An electronic device according to claim 15, wherein:
    the polarity of an EL driver transistor is p-channel type when one of a source region and a drain region of the EL driver transistor is electrically connected to an anode of the EL element; and
    the polarity of an EL driver transistor is n-channel type when one of the source region and the drain region of the EL driver transistor is electrically connected to a cathode of the EL element.

17. An electronic device according to claim 3, wherein:
    the polarity of a switching transistor is identical to the polarity of an EL driver transistor.

18. An electronic device according to claim 15, wherein:
the gate signal lines are composed of aluminum, or of a material having aluminum as its main constituent.

19. An electronic device according to claim 15 wherein said electronic device is selected from the group consisting of an EL display, a video camera, a head mounted display, a DVD player, a personal computer, a portable telephone, a car audio system.

20. An electronic device comprising:
a plurality of source signal lines, a plurality of gate signal lines, a plurality of electric current supply lines, a connection control line, and a plurality of pixels, each of the plurality of pixels having an EL element, a first connection transistor, and a second connection transistor;
wherein a gate electrode of the first connection transistor is electrically connected to the connection control line;
one of a source region and a drain region of the first connection transistor is electrically connected to any one of the plurality of source signal lines, and the other one of the source region and the drain region is electrically connected to any one of the plurality of electric current supply line;
a gate electrode of the second connection transistor is electrically connected to the connection control line; and
one of a source region and a drain region of the second connection transistor is electrically connected to any one of the plurality of gate signal lines, and the other one of the source region and the drain region is electrically connected to any one of the plurality of electric current supply lines.

21. An electronic device according to claim 20, wherein:
the polarity of an EL driver transistor is p-channel type when one of a source region and a drain region of the EL driver transistor is electrically connected to an anode of the EL element; and
the polarity of an EL driver transistor is n-channel type when one of the source region and the drain region of the EL driver transistor is electrically connected to a cathode of the EL element.

22. An electronic device according to claim 20, wherein:
the polarity of a switching transistor is identical to the polarity of an EL driver transistor.

23. An electronic device according to claim 20, wherein:
the gate signal lines are composed of aluminum, or of a material having aluminum as its main constituent.

24. An electronic device according to claim 20, wherein said electronic device is selected from the group consisting of an EL display, a video camera, a head mounted display, a DVD player, a personal computer, a portable telephone, a car audio system.

25. An electronic device comprising:
a plurality of source signal lines, a plurality of gate signal lines, a plurality of electric current supply lines, a connection control line, and a plurality of pixels, each of the plurality of pixels having an EL element, a first connection transistor, and a second connection transistor;
wherein a gate electrode of the first connection transistor is electrically connected to the connection control line;
one of a source region and a drain region of the first connection transistor is electrically connected to any one of the plurality of source signal lines, and the other one of the source region and the drain region is electrically connected to any one of the plurality of electric current supply lines;
a gate electrode of the second connection transistor is electrically connected to the connection control line; and
one of a source region and a drain region of the second connection transistor is electrically connected to any one of the plurality of source signal lines, and the other one of the source region and the drain region is electrically connected to any one of the plurality of gate signal lines.

26. An electronic device according to claim 25, wherein:
the polarity of an EL driver transistor is p-channel type when one of a source region and a drain region of the EL driver transistor is electrically connected to an anode of the EL element; and
the polarity of an EL driver transistor is n-channel type when one of the source region and the drain region of the EL driver transistor is electrically connected to a cathode of the EL element.

27. An electronic device according to claim 25, wherein:
the polarity of a switching transistor is identical to the polarity of an EL driver transistor.

28. An electronic device according to claim 25, wherein:
the gate signal lines are composed of aluminum, or of a material having aluminum as its main constituent.

29. An electronic device according to claim 25 wherein said electronic device is selected from the group consisting of an EL display, a video camera, a head mounted display, a DVD player, a personal computer, a portable telephone, a car audio system.

30. An electronic device comprising:
has a plurality of source signal lines, a plurality of gate signal lines, a plurality of electric current supply lines, a connection control line, and a plurality of pixels, each of the plurality of pixels having an EL element, a first connection transistor, and a second connection transistor;
a gate electrode of the first connection transistor is electrically connected to the connection control line;
one of a source region and a drain region of the first connection transistor is electrically connected to any one of the plurality of gate signal lines, and the other one of the source region and the drain region is electrically connected to any one of the plurality of electric current supply lines;
a gate electrode of the second connection transistor is electrically connected to the connection control line; and
one of a source region and a drain region of the second connection transistor is electrically connected to any one of the plurality of source signal lines, and the other one of the source region and the drain region is electrically connected to any one of the plurality of gate signal lines.

31. An electronic device according to claim 30, wherein:
the polarity of an EL driver transistor is p-channel type when one of a source region and a drian region of the EL driver transistor is electrically connected to an anode of the EL element; and
the polarity of an EL driver transistor is n-channel type when one of the source region and the drain region of the EL driver transistor is electrically connected to a cathode of the EL element.

32. An electronic device according to claim 30, wherein:
the polarity of a switching transistor is identical to the polarity of an EL driver transistor.

33. An electronic device according to claim 30, wherein:
the gate signal lines are composed of aluminum, or of a material having aluminum as its main constituent.

34. An electronic device according to claim 30 wherein said electronic device is selected from the group consisting of an EL display, a video camera, a head mounted display, a DVD player, a personal computer, a portable telephone, a car audio.

35. An electronic device comprising:
has a plurality of source signal lines, a plurality of gate signal lines, a plurality of electric current supply lines, a connection control line, and a plurality of pixels, each of the plurality of pixels having an EL element, a first connection transistor, a second connection transistor, and a third connection transistor;

wherein a gate electrode of the first connection transistor is electrically connected to the connection control line;

one of a source region and a drain region of the first connection transistor is electrically connected to any one of the plurality of source signal lines, and the other one of the source region and the drain region is electrically connected to any one of the plurality of electric current supply lines;

a gate electrode of the second connection transistor is electrically connected to the connection control line;

one of a source region and a drain region of the second connection transistor is electrically connected to any one of the plurality of gate signal lines, and the other one of the source region and the drain region is electrically connected to any one of the plurality of electric current supply lines;

a gate electrode of the third connection transistor is electrically connected to the connection control line; and one of a source region and a drain region of the third connection transistor is electrically connected to any one of the plurality of source signal lines, and the other one of the source region and the drain region is electrically connected to any one of the plurality of gate signal lines.

36. An electronic device according to claim 35, wherein:
the polarity of an EL driver transistor is p-channel type when one of a source region and a drain region of the EL driver transistor is electrically connected to an anode of the EL element; and the polarity of an EL driver transistor is n-channel type when one of the source region and the drain region of the EL driver transistor is electrically connected to a cathode of the EL element.

37. An electronic device according to claim 35, wherein:
the polarity of a switching transistor is identical to the polarity of an EL driver transistor.

38. An electronic device according to claim 35, wherein:
the gate signal lines are composed of aluminum, or of a material having aluminum as its main constituent.

39. An electronic device according to claim 35 wherein said electronic device is selected form the group consisting of an EL display, a video camera, a head mounted display, a DVD player, a personal computer, a portable telephone, a car audio system.

* * * * *